(12) United States Patent
Motz et al.

(10) Patent No.: US 8,466,700 B2
(45) Date of Patent: Jun. 18, 2013

(54) SYSTEM THAT MEASURES CHARACTERISTICS OF OUTPUT SIGNAL

(75) Inventors: Mario Motz, Wernberg (AT); Simon Hainz, Villach (AT); Christof Bodner, Klagenfurt (AT)

(73) Assignee: Infineon Technologies AG, Neubiberg (DE)

( * ) Notice: Subject to any disclaimer, the term of this patent is extended or adjusted under 35 U.S.C. 154(b) by 614 days.

(21) Appl. No.: 12/406,634

(22) Filed: Mar. 18, 2009

(65) Prior Publication Data

US 2010/0237890 A1 Sep. 23, 2010

(51) Int. Cl.
*G01R 31/10* (2006.01)

(52) U.S. Cl.
USPC .................................... 324/750.07

(58) Field of Classification Search
None
See application file for complete search history.

(56) References Cited

U.S. PATENT DOCUMENTS

| | | | | |
|---|---|---|---|---|
| 3,486,113 A * | 12/1969 | Foster | ...................... | 324/123 R |
| 4,361,767 A * | 11/1982 | Pelka et al. | ................... | 340/565 |
| 5,612,494 A * | 3/1997 | Shibano | ...................... | 73/514.32 |
| 6,005,382 A * | 12/1999 | Lee | .............. | 324/76.48 |
| 6,459,314 B2 * | 10/2002 | Kim | ................ | 327/161 |
| 6,495,995 B2 * | 12/2002 | Groom et al. | ................. | 323/283 |
| 6,885,700 B1 | 4/2005 | Kim et al. | | |
| 6,989,718 B2 * | 1/2006 | Pretl et al. | ..................... | 327/157 |
| 7,086,270 B2 | 8/2006 | Weinberg et al. | | |
| 7,098,652 B2 * | 8/2006 | Bolz | ........................ | 324/207.15 |
| 7,158,063 B2 * | 1/2007 | Motz et al. | ................... | 341/143 |
| 7,346,639 B2 * | 3/2008 | Pilgram | ....................... | 708/320 |
| 7,454,946 B2 | 11/2008 | Pitz et al. | | |
| 7,839,195 B1 * | 11/2010 | Feng et al. | .................... | 327/175 |
| 2001/0043097 A1 * | 11/2001 | Akita | ............... | 327/156 |
| 2002/0125869 A1 * | 9/2002 | Groom et al. | ................ | 323/283 |
| 2004/0120437 A1 * | 6/2004 | Casper et al. | ................ | 375/355 |
| 2006/0050830 A1 * | 3/2006 | Da Dalt et al. | ............... | 375/376 |
| 2007/0045259 A1 * | 3/2007 | Beeson et al. | ................ | 219/133 |
| 2007/0255992 A1 * | 11/2007 | Sasagawa | ..................... | 714/736 |
| 2008/0309622 A1 | 12/2008 | Krah | | |
| 2009/0009222 A1 * | 1/2009 | Sano | ............................. | 327/156 |

* cited by examiner

*Primary Examiner* — Jermele M Hollington
(74) *Attorney, Agent, or Firm* — Dicke, Billig & Czaja, PLLC

(57) ABSTRACT

A system including a first circuit and a second circuit. The first circuit includes analog components configured to receive an input signal and provide an output signal based on the input signal. The second circuit is configured to measure characteristics of the output signal to test the first circuit. At least one of the output signal and another output signal is fed back to provide the input signal and generate an oscillation in the output signal.

24 Claims, 13 Drawing Sheets

SYSTEM THAT MEASURES CHARACTERISTICS OF OUTPUT SIGNAL

BACKGROUND

Typically, an electrical system includes electronic components that communicate with one another to perform system functions. The components can be analog or digital components or a combination of analog and digital components in a mixed signal system. The components can be situated on the same integrated circuit chip or on different integrated circuit chips.

Usually, sensor chips include both analog and digital components. The sensors can be any suitable sensors, such as optical sensors, inductive sensors, capacitive sensors, resistive sensors, and magnetic sensors that measure magnetic flux and/or the strength and direction of a magnetic field. The sensors are used in many applications, including scientific, navigational, industrial and automotive applications.

Magnetic sensors use several types of sensing technologies, including Hall effect sensing technologies and magneto-resistive (XMR) sensing technologies. Hall effect sensing elements convert the energy stored in a magnetic field to an electrical signal by developing a voltage between the two edges of a current-carrying conductor whose faces are perpendicular to the magnetic field. XMR sensing elements measure electrical resistance as a function of the applied or ambient magnetic field. XMR sensing elements include anisotropic magneto-resistive (AMR) sensing elements, giant magneto-resistive (GMR) sensing elements, tunneling magneto-resistive (TMR) sensing elements and colossal magneto-resistive (CMR) sensing elements.

In industries, such as the automobile industry, customers drive product quality and safety requirements. Manufacturers strive to reach zero defect manufacturing goals and safety goals, such as Safety Integrity Level (SIL) goals. For sensors, one objective is to detect and report malfunctioning sensors.

Typically, digital components are tested via testing procedures, such as boundary scan testing and IDDQ testing. The digital components can be tested before assembling the system and after assembling the system. Also, the digital components can be tested in the application via watchdog techniques to ensure proper operation of the digital components.

Analog components, however, are often only tested individually before assembling the system. Testing the analog components after assembling the system and/or in the application may be possible, but it adds cost to the system.

For these and other reasons there is a need for the present invention.

SUMMARY

One embodiment described in the disclosure provides a system including a first circuit and a second circuit. The first circuit includes analog components configured to receive an input signal and provide an output signal based on the input signal. The second circuit is configured to measure characteristics of the output signal to test the first circuit. At least one of the output signal and another output signal is fed back to provide the input signal and generate an oscillation in the output signal.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
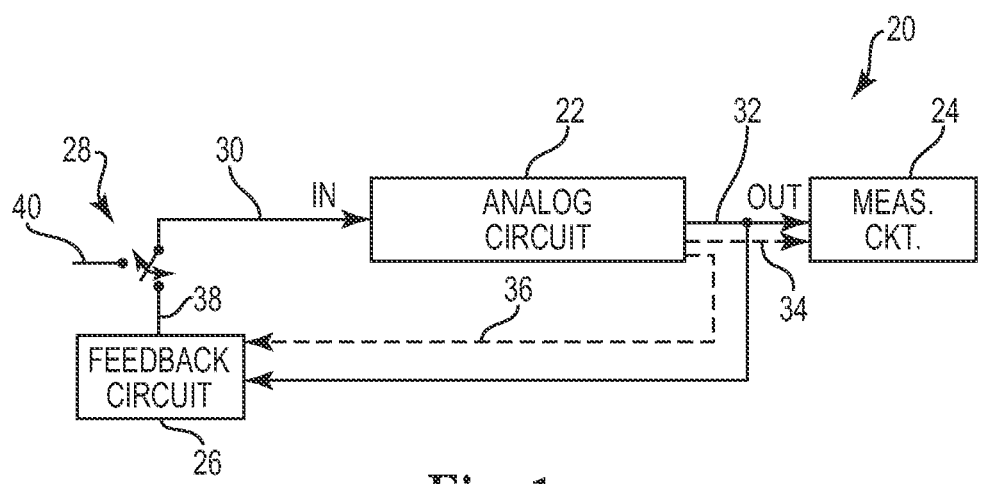
FIG. 1 is a diagram illustrating one embodiment of a system.

FIG. 1 is a diagram illustrating one embodiment of a system 20 that includes analog components and is configured to test at least some of the analog components. In one embodiment, system 20 is an analog system. In one embodiment, system 20 is a mixed signal system. In one embodiment, system 20 is a sensor. In one embodiment, system 20 is a magnetic sensor that includes magnetic sensing elements, such as Hall effect sensing elements or XMR sensing elements. In one embodiment, system 20 is an optical sensor. In one embodiment, system 20 is an inductive sensor. In one embodiment, system 20 is a capacitive sensor. In one embodiment, system 20 is a resistive sensor.

System 20 includes an analog circuit 22, a measurement circuit 24, a feedback circuit 26, and a switch 28. In one embodiment, analog circuit 22 includes only analog components. In one embodiment, analog circuit 22 is a mixed signal circuit that includes analog and digital components.

An input of analog circuit 22 is electrically coupled to an output of switch 28 via input path 30. A first output of analog circuit 22 is electrically coupled to a first input of measurement circuit 24 and a first input of feedback circuit 26 via first feedback path 32. An output of feedback circuit 26 is electrically coupled to an input of switch 28 via feedback output path 38.

Optionally, a second output of analog circuit 22 is electrically coupled to a second input of measurement circuit 24 via output path 34, and/or another output of analog circuit 22 is electrically coupled to a second input of feedback circuit 26 via second feedback path 36. In other embodiments, analog circuit 22 is not electrically coupled to measurement circuit 24 and feedback circuit 26 via first feedback path 32, but analog circuit 22 is electrically coupled to measurement circuit 24 via output path 34 and to feedback circuit 26 via second feedback path 36.

Analog circuit 22, measurement circuit 24 and feedback circuit 26 communicate with one another to test system functions. In one embodiment, analog circuit 22, measurement circuit 24 and feedback circuit 26 are on one integrated circuit chip. In other embodiments, analog circuit 22, measurement circuit 24 and feedback circuit 26 are on multiple integrated circuit chips.

System 20 functions in normal mode operation and self-test mode operation. In normal mode operation, system 20 switches input path 30 to an open state at 40. In self-test mode operation, system 20 switches input path 30 to the output at 38 of feedback circuit 26. System 20 controls switch 28 via control logic (not shown for clarity) to switch input path 30 between the open state at 40 and the output at 38. In one embodiment, switch 28 is electrically coupled to a reference, such as ground, at 40.

In normal mode operation, system 20 performs system functions. Analog circuit 22 receives or generates an input signal and provides an output signal based on the input signal. Analog components in analog circuit 22 process the input signal to provide the output signal based on the input signal. In one embodiment, switch 28 is electrically coupled to a signal source at 40 and analog circuit 22 receives an input signal via input path 30. In one embodiment, analog circuit 22 receives an input signal via another input path. In one embodiment, switch 28 switches to the open state at 40 in normal mode operation and analog circuit 22 includes a sensor circuit that generates an input signal, which is processed via analog circuit 22.

In self-test mode operation, system 20 tests at least some of the analog components in analog circuit 22 and, if analog circuit 22 is a mixed signal circuit, system 20 may also test at least some of the digital components. Feedback circuit 26 provides input signal IN at 30 to analog circuit 22 and at least some of the analog components in analog circuit 22 process the input signal at 30 to provide output signal OUT at 32 based on input signal IN at 30. In one embodiment, output signal OUT at 32 is an internal signal of analog circuit 22 brought out for testing. In one embodiment, output signal OUT at 32 is the normal mode output signal of analog circuit 22 brought out for testing.

In one embodiment, feedback circuit 26 provides input signal IN at 30 to analog circuit 22 and at least some of the analog components in analog circuit 22 process the input signal at 30 to provide the output signal at 34 based on input signal IN at 30, where the output signal at 34 is either an internal signal of analog circuit 22 or the normal mode output signal of analog circuit 22. In one embodiment, feedback circuit 26 provides input signal IN at 30 to analog circuit 22 and at least some of the analog components in analog circuit 22 process the input signal at 30 to provide the feedback signal at 36 based on input signal IN at 30, where the feedback signal at 36 is either an internal signal of analog circuit 22 or the normal mode output signal of analog circuit 22. In other embodiments, analog circuit 22 does not provide output signal OUT at 32, instead providing the separate signals of the output signal at 34 and the feedback signal at 36.

Output signal OUT at 32 is fed back to feedback circuit 26 and feedback circuit 26 provides input signal IN at 30. Measurement circuit 24 receives output signal OUT at 32 and measures characteristics of output signal OUT at 32. If the characteristics of output signal OUT at 32 are outside established limits, analog circuit 22 and/or feedback circuit 26 is not functioning properly and measurement circuit 26 indicates or reports that system 20 is a malfunctioning system.

In one embodiment, measurement circuit 24 receives at least one other output signal from analog circuit 22, such as the output signal at 34, and measures characteristics of the received signal(s) and if the characteristics of the received signal(s) are outside established limits, analog circuit 22 and/or feedback circuit 26 is not functioning properly and measurement circuit 26 indicates or reports that system 20 is a malfunctioning system. In one embodiment, measurement circuit 24 does not receive output signal OUT at 32, but receives the output signal at 34 and measures characteristics of the output signal at 34 and if the characteristics of the output signal at 34 are outside established limits, analog circuit 22 and/or feedback circuit 26 is not functioning properly and measurement circuit 26 indicates or reports that system 20 is a malfunctioning system.

In one embodiment, feedback circuit 26 receives at least one other feedback signal, such as the feedback signal at 36, and feedback circuit 26 provides input signal IN at 30 based on the received feedback signal(s). In one embodiment, feedback circuit 26 does not receive output signal OUT at 32, but receives the feedback signal at 36 and feedback circuit 26 provides input signal IN at 30 based on the feedback signal at 36. In one embodiment, system 20 is a magnetic sensor and analog circuit 22 includes magnetic sensing elements, such as Hall effect sensing elements or XMR sensing elements. In normal operation, the magnetic sensing elements provide a sensed input signal and analog circuit 22 provides a sensed output signal at 32. In self-test operation, feedback circuit 26 provides input signal IN at 30 to analog circuit 22 and analog circuit 22 provides output signal OUT at 32. Output signal OUT at 32 is fed back to feedback circuit 26 and feedback circuit 26 provides input signal IN at 30. Measurement circuit 24 receives and measures characteristics of output signal OUT at 32. In one embodiment, measurement circuit 24 receives at least one other output signal from analog circuit 22 and measures characteristics of the received signal(s).

In one embodiment, system 20 is a magnetic sensor and magnetic sensing elements, such as Hall effect sensing elements or XMR sensing elements, are not part of analog circuit 22 or feedback circuit 26. In normal operation, the magnetic sensing elements provide a sensed input signal to analog circuit 22 and analog circuit 22 provides a sensed output signal. In self-test operation, feedback circuit 26 provides input signal IN at 30 to analog circuit 22 and analog circuit 22 provides output signal OUT at 32. Output signal OUT at 32 is fed back to feedback circuit 26 and feedback circuit 26 provides input signal IN at 30. Measurement circuit 24 receives and measures characteristics of output signal OUT at 32. In one embodiment, measurement circuit 24 receives at least one other output signal from analog circuit 22 and measures characteristics of the received signal(s).

In self-test operation, one or more of the analog components in analog circuit 22 receive input signal IN at 30 and provide output signal OUT at 32 based on input signal IN at 30. Output signal OUT at 32 is received by feedback circuit 26 and processed via feedback circuit 26 to provide input signal IN at 30 and generate an oscillation in output signal OUT at 32. In one embodiment, feedback circuit 26 includes a delay circuit. In one embodiment, feedback circuit 26 includes a digital delay circuit. In one embodiment, feedback circuit 26 includes a digital delay circuit and an up/down counter. In one embodiment, analog circuit 22 includes a hysteresis comparator that provides output signal OUT at 32, which is fed back via feedback circuit 26 to provide input signal IN at 30.

In one embodiment, feedback circuit 26 receives output signal OUT at 32 and the feedback signal at 36 and provides input signal IN at 30, which generates an oscillation in output signal OUT at 32 and/or the output signal at 34. In one embodiment, feedback circuit 26 receives the feedback signal at 36, but not output signal OUT at 32, and provides input signal IN at 30, which generates an oscillation in the output signal at 34.

Measurement circuit 24 receives output signal OUT at 32 and measures characteristics of output signal OUT at 32 to test analog circuit 22. If the characteristics of output signal OUT at 32 are outside established limits, analog circuit 22 and/or feedback circuit 26 is not functioning properly and measurement circuit 26 indicates or reports an error or malfunctioning of system 20. In one embodiment, measurement circuit 24 measures characteristics such as amplitude, frequency, duty cycle, and jitter. In one embodiment, measurement circuit 24 measures one or more characteristics, such as the root-mean-square (RMS) of amplitude, amplitude crest, amplitude peak, frequency, frequency components, phase differences in signals, duty cycle, jitter, offset, and switching pulses.

In one embodiment, measurement circuit 24 receives the output signal at 34 and measures characteristics of the output signal at 34 to test analog circuit 22. If the characteristics are outside established limits, analog circuit 22 and/or feedback circuit 26 is not functioning properly and measurement circuit 26 indicates or reports an error or malfunctioning of system 20.

System 20 measures the characteristics of output signal OUT at 32 and/or other signals from analog circuit 22 to test analog circuit 22. If analog circuit 22 is not functioning within established limits, system 20 reports the failure. System 20 can be configured to perform selected measurements or all measurements at selected times. Self-testing of system 20 can be used for production testing, such as production testing after assembly of system 20, at power-up of system 20 and/or at other selected times in the application. In one embodiment, system 20 is a sensor in an automobile application and system 20 performs self-testing of analog components to meet manufacturing goals and safety objectives, such as zero defect manufacturing goals and SIL goals.

Figure 2:
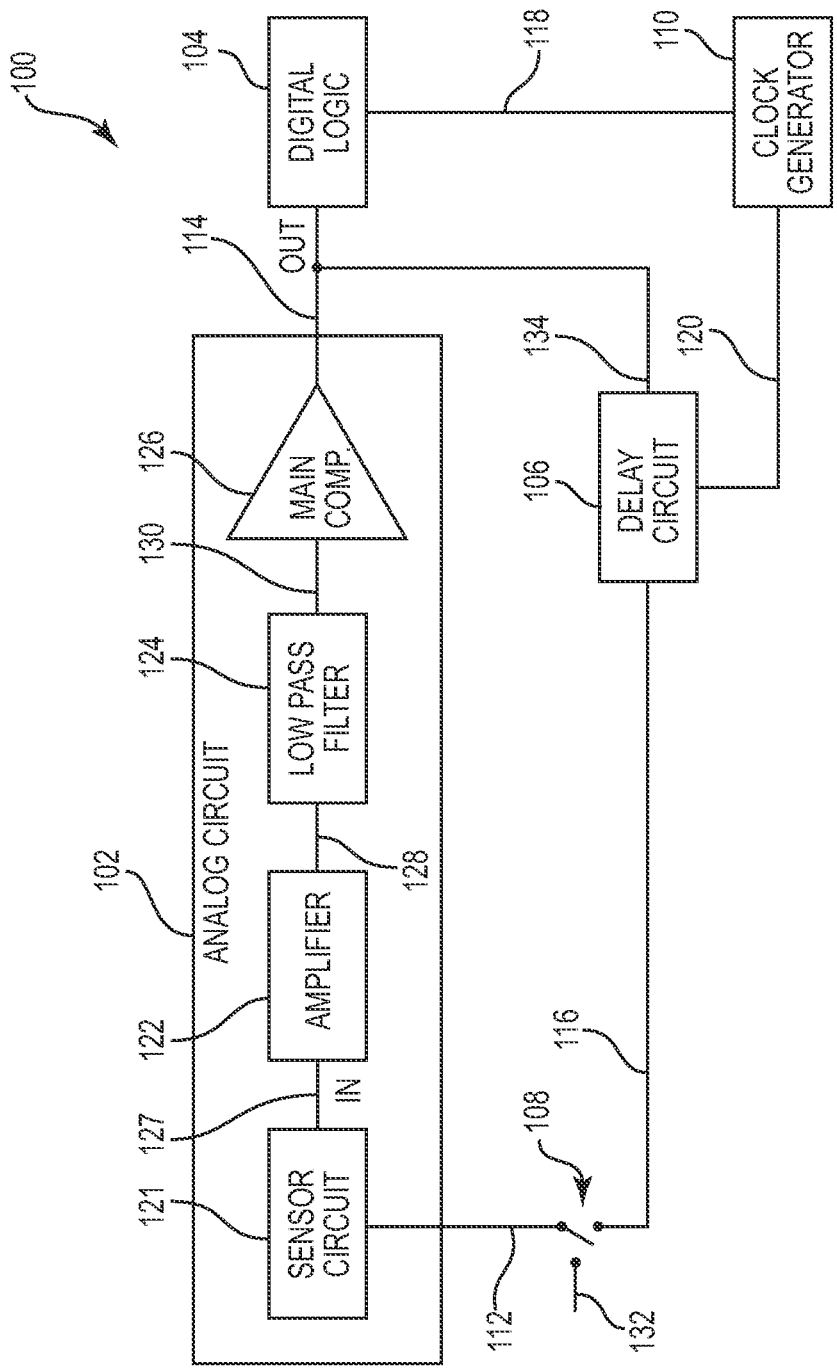
FIG. 2 is a diagram illustrating one embodiment of a sensor.

FIG. 2 is a diagram illustrating one embodiment of a sensor 100 that includes a self-test mode operation for testing analog circuit 102. Sensor 100 performs normal mode operations and self-test mode operations. In one embodiment, sensor 100 is similar to system 20. In one embodiment, sensor 100 performs self-tests to meet manufacturing goals and safety objectives, such as zero defect manufacturing goals and SIL goals. In one embodiment, sensor 100 performs self-tests at one or more of production testing, power-up and other selected times in the application.

Sensor 100 includes analog circuit 102, digital logic circuit 104, delay circuit 106, switch 108 and clock generator 110. Analog circuit 102 is electrically coupled to switch 108 via feedback input path 112 and to digital logic circuit 104 and delay circuit 106 via first feedback path 114. Delay circuit 106 is electrically coupled to switch 108 via second feedback path 116. Clock generator 110 is electrically coupled to digital logic circuit 104 via first clock path 118 and to delay circuit 106 via second clock path 120.

Analog circuit 102, digital logic circuit 104, delay circuit 106, switch 108 and clock generator 110 communicate with one another to perform sensor operations. In one embodiment, analog circuit 102, digital logic circuit 104, delay circuit 106, switch 108 and clock generator 110 are on one integrated circuit chip. In other embodiments, analog circuit 102, digital logic circuit 104, delay circuit 106, switch 108 and clock generator 110 are on multiple integrated circuit chips.

Analog circuit 102 includes a sensor circuit 121, an amplifier 122, a low pass filter 124 and a main comparator 126. An input of sensor circuit 121 is electrically coupled to switch 108 via feedback input path 112. Amplifier 122 is electrically coupled to sensor circuit 121 via input path 127 and to low pass filter 124 via amplifier output path 128. Main comparator 126 is electrically coupled to low pass filter 124 via filtered output path 130 and to digital logic circuit 104 and delay circuit 106 via first feedback path 114.

Sensor 100 functions in normal mode operation and self-test mode operation. In normal mode operation, sensor 100 controls switch 108 to switch feedback input path 112 to an open state at 132. In self-test mode operation, sensor 100 controls switch 108 to switch feedback input path 112 to the output at 116 of delay circuit 106. Sensor 100 controls switch 108 via control logic (not shown for clarity) to switch feedback input path 112 between the open state at 132 and the output at 116. In one embodiment, switch 108 is coupled to a reference, such as ground, at 132.

In other embodiments, the input of sensor circuit 121 is electrically coupled to the output of delay circuit 106 and a switch is situated at a different place in sensor 100. In one embodiment, a switch is situated at the input 134 of delay circuit 106. In one embodiment, a switch is situated in second clock path 120, such that delay circuit 106 is not clocked and provides a constant voltage level in normal mode operations.

Sensor circuit 121 functions in normal mode operation and self-test mode operation. In normal mode operation, sensor circuit 121 senses events and provides a sensed signal at 127 that corresponds to the sensed events. In self-test mode operation, sensor circuit 121 receives a delayed feedback signal at 112 and provides input signal IN at 127, which generates an oscillation in test output signal OUT at 114. In one embodiment, sensor circuit 121 includes magnetic sensing elements. In one embodiment, sensor circuit 121 includes Hall effect sensing elements. In one embodiment, sensor circuit 121 includes XMR sensing elements. In one embodiment, sensor circuit 121 is an optical sensor circuit. In one embodiment, sensor circuit 121 is an inductive sensor circuit. In one embodiment, sensor circuit 121 is a capacitive sensor circuit. In one embodiment, sensor circuit 121 is a resistive sensor circuit.

Analog circuit 102 functions in normal mode operation and self-test mode operation. In normal mode operation, amplifier 122 receives the sensed signal at 127 and provides an amplified sensed signal to low pass filter 124 via amplifier output path 128. Low pass filter 124 receives and filters the amplified sensed signal at 128 and provides a filtered sensed signal to main comparator 126 via filtered output path 130. Main comparator 126 receives the filtered sensed signal at 130 and provides a sensed output signal to digital logic circuit 104 via first feedback path 114. In self-test mode operation, amplifier 122 receives input signal IN at 127 and provides an amplified test signal to low pass filter 124 via amplifier output path 128. Low pass filter 124 receives and filters the amplified test signal at 128 and provides a filtered test signal to main comparator 126 via filtered output path 130. Main comparator 126 receives the filtered test signal at 130 and provides test output signal OUT at 114. In one embodiment, the input signals at 127, the amplified signals at 128 and the filtered signals at 130 are differential signals.

Delay circuit functions in self-test mode operation, where delay circuit 106 receives test output signal OUT at 114 and delays the output signal to provide the delayed feedback signal at 116 to sensor circuit 121. Sensor circuit 121 receives the delayed feedback signal and provides input signal IN at 127, which generates the oscillation in test output signal OUT at 114. In one embodiment, delay circuit 106 is a digital delay circuit. In one embodiment, delay circuit 106 is a digital delay circuit including clocked flip-flop circuits.

Digital logic circuit 104 functions in normal mode operation and self-test mode operation. In normal mode operation, digital logic circuit 104 receives the sensed output signal from analog circuit 102 and provides an output signal to other circuits. The output signal corresponds to the sensed signal from sensor circuit 121. In self-test operation, digital logic circuit 104 receives test output signal OUT at 114 and functions similar to measurement circuit 24. Digital logic circuit 104 measures characteristics of test output signal OUT at 114. If the characteristics of test output signal OUT at 114 are outside established limits, analog circuit 102 and/or one or more circuits in the feedback path, such as delay circuit 106, is not functioning properly and digital logic circuit 104 reports an error or the malfunctioning of sensor 100. In one embodiment, digital logic circuit 104 measures characteristics such as amplitude, frequency, duty cycle, and jitter of test output signal OUT at 114. In one embodiment, digital logic circuit 104 measures one or more characteristics, such as the root-mean-square (RMS) of amplitude, amplitude crest, amplitude peak, frequency, frequency components, phase differences in signals, duty cycle, jitter, offset, and switching pulses.

In one embodiment, a circuit, such as digital logic circuit 104, receives the filtered test signal at 130 and the amplitude of the filtered test signal at 130 is analyzed to determine whether amplifier 122 and low pass filter 124 are operating within functional limits. In one embodiment, digital logic circuit 104 controls switch 108 to switch between normal mode operation and self-test mode operation.

Clock generator 110 provides a clock signal to delay circuit 106 and digital logic circuit 104. In one embodiment, delay circuit 106 is a digital delay circuit and clock generator 110 provides a clock signal to the digital delay circuit. In one embodiment, low pass filter 124 includes first resistor and capacitor characteristics and clock generator 110 uses a bandgap reference, where clock generator 110 and the bandgap reference include second resistor and capacitor characteristics that are substantially the same as or match the first resistor and capacitor characteristics over process variations and temperature.

In normal mode operation of sensor 100, sensor circuit 121 senses events and provides the sensed signal at 127 that corresponds to the sensed events. Amplifier 122 receives the sensed signal at 127 and provides the amplified sensed signal at 128. Low pass filter 124 receives and filters the amplified sensed signal at 128 and provides the filtered sensed signal at 130. Main comparator 126 receives the filtered sensed signal at 130 and provides the sensed output signal at 114. Digital logic circuit 104 receives the sensed output signal from analog circuit 102 and provides the output signal or a corresponding output signal to other circuits, where the output signal corresponds to the sensed signal from sensor circuit 121.

In self-test mode operation, sensor 100 generates an oscillating test output signal OUT at 114 and measures characteristics of the test output signal at 114 to test analog circuit 102. Sensor circuit 121 receives a delayed feedback signal at 112 and provides input signal IN at 127, which generates the oscillation in test output signal OUT at 114. Amplifier 122 receives input signal IN at 127 and provides the amplified test signal at 128. Low pass filter 124 receives and filters the amplified test signal at 128 and provides the filtered test signal at 130. Main comparator 126 receives the filtered test signal at 130 and provides the test output signal OUT at 114. Delay circuit 106 receives test output signal OUT at 114 and delays the output signal to provide the delayed feedback signal at 116 and 112. Digital logic circuit 104 receives test output signal OUT at 114 and measures characteristics of test output signal OUT at 114. If the characteristics of test output signal OUT at 114 and/or other signals received from analog circuit 102 are outside established limits, analog circuit 102 and/or one or more circuits in the feedback path, such as delay circuit 106, is not functioning properly and digital logic circuit 104 reports the failure or malfunctioning of sensor 100.

Figure 3:
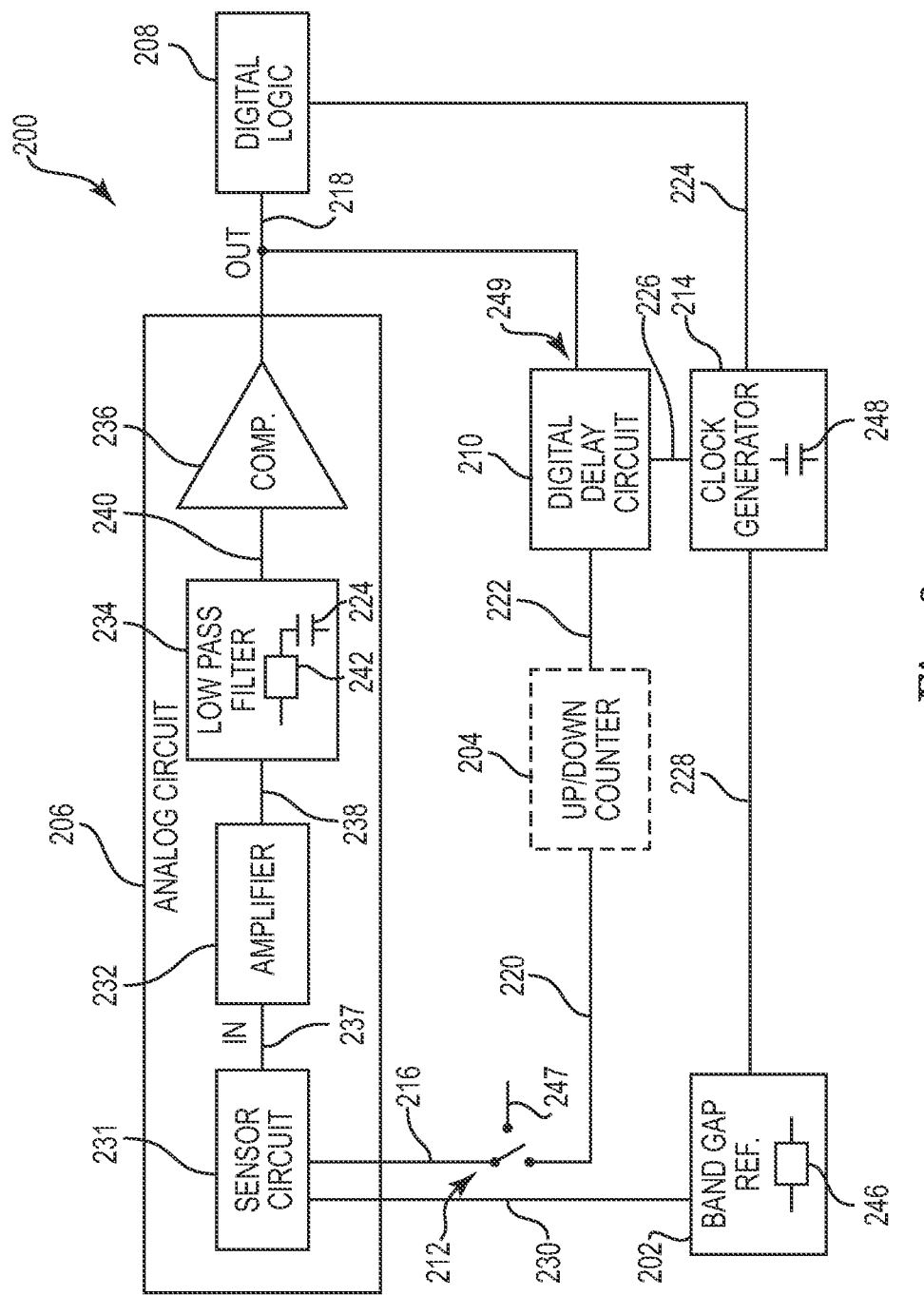
FIG. 3 is a diagram illustrating one embodiment of a sensor that includes a bandgap reference and, optionally, an up-down filter.

FIG. 3 is a diagram illustrating one embodiment of a sensor 200 that includes a bandgap reference 202 and, optionally, an up/down counter 204. Sensor 200 performs normal mode operations and self-test mode operations that test analog circuit 206. In one embodiment, sensor 200 is similar to system 100. In one embodiment, sensor 200 is similar to system 20. In one embodiment, sensor 200 performs self-tests to meet manufacturing goals and safety objectives, such as zero defect manufacturing goals and SIL goals. In one embodiment, sensor 200 performs self-tests at one or more of production testing, power-up and other selected times in the application.

Sensor 200 includes bandgap reference 202 and, optionally, up/down counter 204. Sensor 200 also includes analog circuit 206, digital logic circuit 208, digital delay circuit 210, switch 212 and clock generator 214. Analog circuit 206 is electrically coupled to switch 212 via feedback input path 237 and to digital logic circuit 208 and digital delay circuit 210 via first feedback path 218. Digital delay circuit 210 is electrically coupled to switch 212 via second and third feedback paths 220 and 222. Optionally, sensor 200 includes up/down counter 204 and digital delay circuit 210 is electrically coupled to up/down counter 204 via third feedback path 222, where up/down counter 204 is electrically coupled to switch 212 via second feedback path 220. Clock generator 214 is electrically coupled to digital logic circuit 208 via first clock path 224 and to digital delay circuit 210 via second clock path 226. Also, clock generator 214 is electrically coupled to bandgap reference 202 via first bandgap path 228 and bandgap reference 202 is electrically coupled to sensor circuit 212 via second bandgap path 230.

The components of sensor 200, including bandgap reference 202, optionally up/down counter 204, analog circuit 206, digital logic circuit 208, digital delay circuit 210, switch 212 and clock generator 214, communicate with one another to perform sensor operations. In one embodiment, all of these components are on one integrated circuit chip. In other embodiments, one or more of these components are on other integrated circuit chips.

Analog circuit 206 includes sensor circuit 231, an amplifier 232, a low pass filter 234 and a main comparator 236. Sensor circuit 231 is electrically coupled to switch 212 via feedback input path 216. Amplifier 232 is electrically coupled to sensor circuit 231 via input path 237 and to low pass filter 234 via amplifier output path 238. Main comparator 236 is electrically coupled to low pass filter 234 via filtered output path 240 and to digital logic circuit 208 and delay circuit 210 via first feedback path 218.

Sensor 200 functions in normal mode operation and self-test mode operation. In normal mode operation, sensor 200 controls switch 212 to switch feedback input path 216 to an open state at 247. In self-test mode operation, sensor 200 controls switch 212 to switch feedback input path 216 to the output at 220 of delay circuit 210 or, optionally, the output at 220 of up/down counter 204. Sensor 200 controls switch 212 via control logic (not shown for clarity) to switch feedback input path 216 between the open state at 247 and the output at 220. In one embodiment, switch 212 is coupled to a reference, such as ground, at 247.

In other embodiments, the feedback input of sensor circuit 231 is electrically coupled to the output of delay circuit 210 or, optionally, the output of up/down counter 204 and a switch is situated at a different place in sensor 200. In one embodiment, a switch is situated at the input 249 of delay circuit 210. In one embodiment, a switch is situated in feedback path 222. In one embodiment, a switch is situated in second clock path 226, such that delay circuit 210 is not clocked and provides a constant voltage level in normal mode operations.

Sensor circuit 231 functions in normal mode operation and self-test mode operation. In normal mode operation, sensor circuit 231 senses events and provides a sensed signal at 237 that corresponds to the sensed events. In self-test mode operation, sensor circuit 231 receives a delayed feedback signal at 220 and provides input signal IN at 237, which generates an oscillation in test output signal OUT at 218. In one embodiment, sensor circuit 231 includes magnetic sensing elements. In one embodiment, sensor circuit 231 includes XMR sensing elements. In one embodiment, sensor circuit 231 includes Hall effect sensing elements. In one embodiment, sensor circuit 231 includes Hall effect sensing elements and bandgap reference 202 is used to set the current that flows through the Hall sensing elements. In one embodiment, sensor circuit 231 is an optical sensor circuit. In one embodiment, sensor circuit 231 is an inductive sensor circuit. In one embodiment, sensor circuit 231 is a capacitive sensor circuit. In one embodiment, sensor circuit 231 is a resistive sensor circuit.

Analog circuit 206 functions in normal mode operation and self-test mode operation. In normal mode operation, amplifier 232 receives the sensed signal at 237 and provides an amplified sensed signal to low pass filter 234 via amplifier output path 238. Low pass filter 234 receives and filters the amplified sensed signal at 238 and provides a filtered sensed signal to main comparator 236 via filtered output path 240. Main comparator 236 receives the filtered sensed signal at 240 and provides a sensed output signal to digital logic circuit 208 via first feedback path 218. In self-test mode operation, amplifier 232 receives input signal IN at 237 and provides an amplified test signal to low pass filter 234 via amplifier output path 238. Low pass filter 234 receives and filters the amplified test signal at 238 and provides a filtered test signal to main comparator 236 via filtered output path 240. Main comparator 236 receives the filtered test signal at 240 and provides test output signal OUT at 218. In one embodiment, the input signals at 237, the amplified signals at 238 and the filtered signals at 240 are differential signals.

Digital delay circuit 210 and, optionally, up/down counter 204 function in self-test mode operation. Digital delay circuit 210 receives test output signal OUT at 218 and a clock signal from clock generator 214 via second clock path 226. Digital delay circuit 210 uses the clock signal at 226 to delay test output signal OUT at 218 and provide a delayed feedback signal at 222. The delayed feedback signal at 222 is provided to sensor circuit 231 via second feedback path 220 or, optionally, up/down counter 204 receives the delayed feedback signal at 222 and provides a count in a delayed feedback signal to sensor circuit 231 via second feedback path 220. Up/down counter 204 counts up and down based on the delayed feedback signal at 222 to obtain the count value. Sensor circuit 231 receives the delayed feedback signal at 220 via digital delay circuit 210 or, optionally, up/down counter 204 and switches input signal IN at 237 based on the delayed feedback signal at 220, which generates the oscillation in test output signal OUT at 218. If a count is provided in the feedback signal at 220, sensor circuit 231 can use the count value to adjust input signal IN at 237. In one embodiment, digital delay circuit 210 includes flip-flops that are clocked via the clock signal at 226.

Digital logic circuit 208 functions in normal mode operation and self-test mode operation. In normal mode operation, digital logic circuit 208 receives the sensed output signal at 218 and provides an output signal to other circuits. The output signal corresponds to the sensed signals from sensor circuit 231. In self-test mode operation, digital logic circuit 208 receives and measures characteristics of test output signal OUT at 218 and/or other signals from analog circuit 206. If the characteristics of test output signal OUT at 218 and/or the other signals are outside established limits, analog circuit 206 and/or one or more circuits in the feedback path, such as digital delay circuit 210 and up/down counter 204, is not functioning properly and digital logic circuit 208 reports an error or the malfunctioning of sensor 200. In one embodiment, digital logic circuit 208 measures characteristics such as amplitude, frequency, duty cycle, and jitter of test output signal OUT at 218. In one embodiment, digital logic circuit 208 measures one or more characteristics, such as the root-mean-square (RMS) of amplitude, amplitude crest, amplitude peak, frequency, frequency components, phase differences in signals, duty cycle, jitter, offset, and switching pulses.

In one embodiment, a circuit, such as digital logic circuit 208, receives the filtered test signal at 240 and the amplitude of the filtered test signal at 240 is analyzed to determine whether amplifier 232 and low pass filter 234 are operating within functional limits. In one embodiment, digital logic circuit 208 controls sensor 200 to switch between normal mode operation and self-test mode operation.

Clock generator 214 provides a clock signal to digital logic circuit 208 via first clock path 224 and a clock signal to digital delay circuit 210 via second clock path 226. Clock generator 214 uses bandgap reference 202 to provide the clock signal at 226.

Low pass filter 234 includes a first resistor 242 coupled to a first capacitor 244 that provide first resistor and capacitor characteristics over process and temperature variations. Bandgap reference 202 includes a second resistor 246 and clock generator 214 includes a second capacitor 248 that provide second resistor and capacitor characteristics over process and temperature variations. The second resistor and capacitor characteristics match the first resistor and capacitor characteristics over process and temperature variations, such that clock generator 214 changes the frequency of the clock signal at 226, which changes the delay through digital delay circuit 210 and compensates for changes in low pass filter 234. Thus, the duty cycle does not change over process and temperature variations.

In normal mode operation of sensor 200, sensor circuit 231 senses events and provides a sensed signal at 237 that corresponds to the sensed events. Amplifier 232 receives the sensed signal at 237 and provides an amplified sensed signal at 238. Low pass filter 234 receives and filters the amplified sensed signal at 238 and provides a filtered sensed signal at 240. Main comparator 236 receives the filtered sensed signal at 240 and provides a sensed output signal at 218. Digital logic circuit 208 receives the sensed output signal at 218 and provides an output signal to other circuits, where the output signal corresponds to the sensed signals from sensor circuit 231.

In self-test mode operation, sensor 200 generates an oscillating test output signal OUT at 218 and measures characteristics of the test output signal at 218 to test analog circuit 206. Sensor circuit 231 receives a delayed feedback signal at 220 and switches input signal IN at 237 to generate the oscillation in test output signal OUT at 218. Amplifier 232 receives input signal IN at 237 and provides an amplified test signal at 238. Low pass filter 234 receives and filters the amplified test signal at 238 and provides a filtered test signal at 240. Main comparator 236 receives the filtered test signal at 240 and provides the test output signal OUT at 218. Digital delay circuit 210 receives test output signal OUT at 218 and delays the output signal to provide a delayed feedback signal at 222. Optionally, up/down counter 204 receives the delayed feedback signal at 222 and provides a count in a delayed feedback signal at 220 to sensor circuit 231. Without up/down counter 204 in sensor 200, the delayed feedback signal at 222 is provided to sensor circuit 231 via second feedback path 220. Sensor circuit 231 receives the delayed feedback signal at 220 and switches input signal IN at 237. If a count is provided in the feedback signal at 220, sensor circuit 231 can use the count value to adjust input signal IN at 237. Digital logic circuit 208 receives test output signal OUT at 218 and measures characteristics of test output signal OUT at 218. If the characteristics of test output signal OUT at 218 and/or other signals from analog circuit 206 are outside established limits, analog circuit 206 and/or one or more circuits in the feedback path, such as digital delay circuit 210 and up/down counter 204, is not functioning properly and digital logic circuit 208 reports the failure or malfunctioning of sensor 200.

Figure 4:
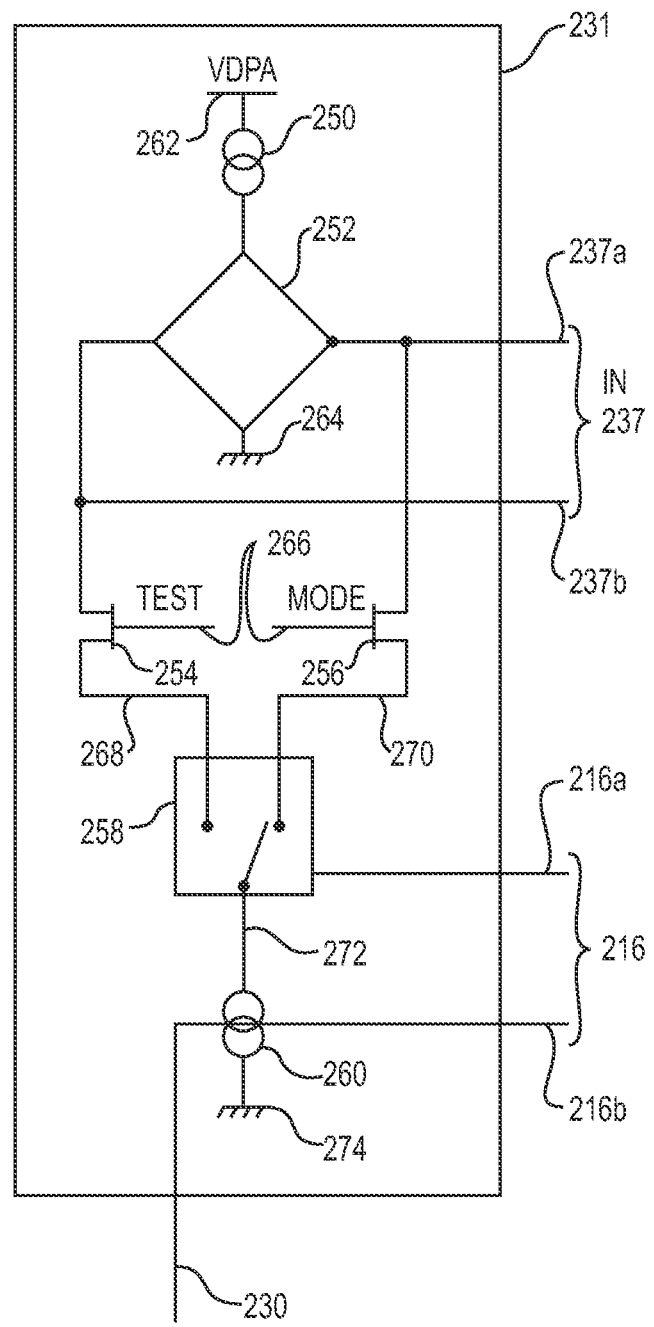
FIG. 4 is a diagram illustrating one embodiment of a sensor circuit.

FIG. 4 is a diagram illustrating one embodiment of sensor circuit 231. In sensor 200, sensor circuit 231 is electrically coupled to amplifier 232 via input path 237 and to up/down counter 204 via feedback input path 216 and switch 212. Input path 237 includes differential input paths 237a and 237b and feedback input path 216 includes switch feedback path 216a and current source feedback path 216b. Also, sensor circuit 231 is electrically coupled to bandgap reference 202 via second bandgap path 230.

Sensor circuit 231 functions in normal mode operation and self-test mode operation. In normal mode operation, sensor circuit 231 senses events and provides a sensed signal at 237 that corresponds to the sensed events. In self-test mode operation, sensor circuit 231 receives a delayed feedback signal at 216 and provides input signal IN at 237, which generates an oscillation in test output signal OUT at 218.

Sensor circuit 231 includes a first current source 250, a Hall effect sensing element 252, first and second self-test transistors 254 and 256, a switch 258 and a second current source 260. First current source 250 is electrically coupled to an analog power supply VDDA at 262 and to one corner of Hall effect sensing element 252. An opposing corner of Hall effect sensing element 252 is electrically coupled to a reference, such as ground, at 264. First current source 250 provides current that flows through Hall effect sensing element 252 to the reference at 264.

Hall effect sensing element 252 is electrically coupled to first and second self-test transistors 254 and 256. A third corner of Hall effect sensing element 252 is electrically coupled to the drain-source path of first self-test transistor 254 via differential input path 237b. A fourth corner of Hall effect sensing element 252 is electrically coupled to the drain-source path of second self-test transistor 256 via differential input path 237a. The gates of first and second self-test transistors 254 and 256 are electrically coupled to receive test signal TEST MODE at 266.

The other side of the drain-source path of first self-test transistor 254 is electrically coupled to switch 258 via first switch path 268 and the other side of the drain-source path of second self-test transistor 256 is electrically coupled to switch 258 via second switch path 270. Switch 258 is electrically coupled to second current source 260 via current path 272 and second current source 260 is electrically coupled to a reference, such as ground, at 274. Switch 258 is electrically coupled to up/down counter 204 via switch feedback path 216a and second current source 260 is electrically coupled to up/down counter 204 via current source feedback path 216b. Second current source 260 is electrically coupled to bandgap reference 202 via second bandgap path 230.

In normal mode operation, first and second self-test transistors 254 and 256 receive an inactive test signal at 266, which turns off first and second self-test transistors 254 and 256. Hall effect sensing element 252 senses a magnetic field and provides a sensed signal via differential input paths 237a and 237b. The sensed signal at 237 corresponds to the sensed magnetic field. The sensed signal across differential input paths 237a and 237b is provided to and received by amplifier 232.

In self-test mode operation, first and second self-test transistors 254 and 256 receive an active test signal at 266, which turns on first and second self-test transistors 254 and 256. One of the differential input paths 237a and 237b is pulled low relative to the other one of the differential input paths 237a and 237b via switch 258 and second current source 260. This provides input signal IN at 237. Amplifier 232 receives input signal IN at 237 and analog circuit 206 provides output signal OUT at 218, which is fed back via digital delay circuit 210 and up/down counter 204.

Up/down counter 204 receives the delayed feedback signal at 222 and provides a switch signal at 216a that controls switch 258. Up/down counter 204 switches switch 258 to pull the other one of the differential input paths 237a and 237b low relative to the first one of the differential input paths 237a and 237b via switch 258 and second current source 260. This switches the voltages on differential input paths at 237a and 237b and input signal IN at 237. Amplifier 232 receives the switched input signal IN at 237 and analog circuit 206 provides a corresponding output signal OUT at 218, which is fed back via digital delay circuit 210 and up/down counter 204.

The process repeats to generate an oscillation in input signal IN at 237 and output signal OUT at 218.

Up/down counter 204 provides a count value to second current source 260. This count value sets the current flow through second current source 260, such that input signal IN at 237 can be adjusted based on the count value. In one embodiment, up/down counter obtains the count value by counting up during one phase of the delayed feedback signal at 222 and down during the other phase of the delayed feedback signal at 222. In other embodiments, digital delay circuit 210 or up/down counter 204 control only switch 258 to generate an oscillation in input signal IN at 237 and output signal OUT at 218.

Figure 5:
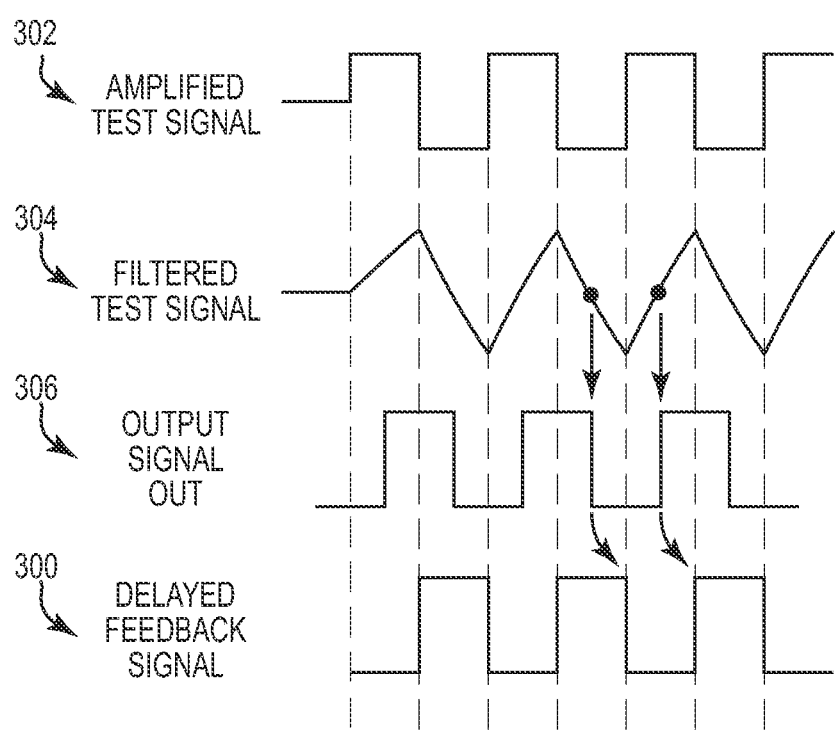
FIG. 5 is a timing diagram illustrating a sensor functioning within established limits during self-test operations.
Figure 6:
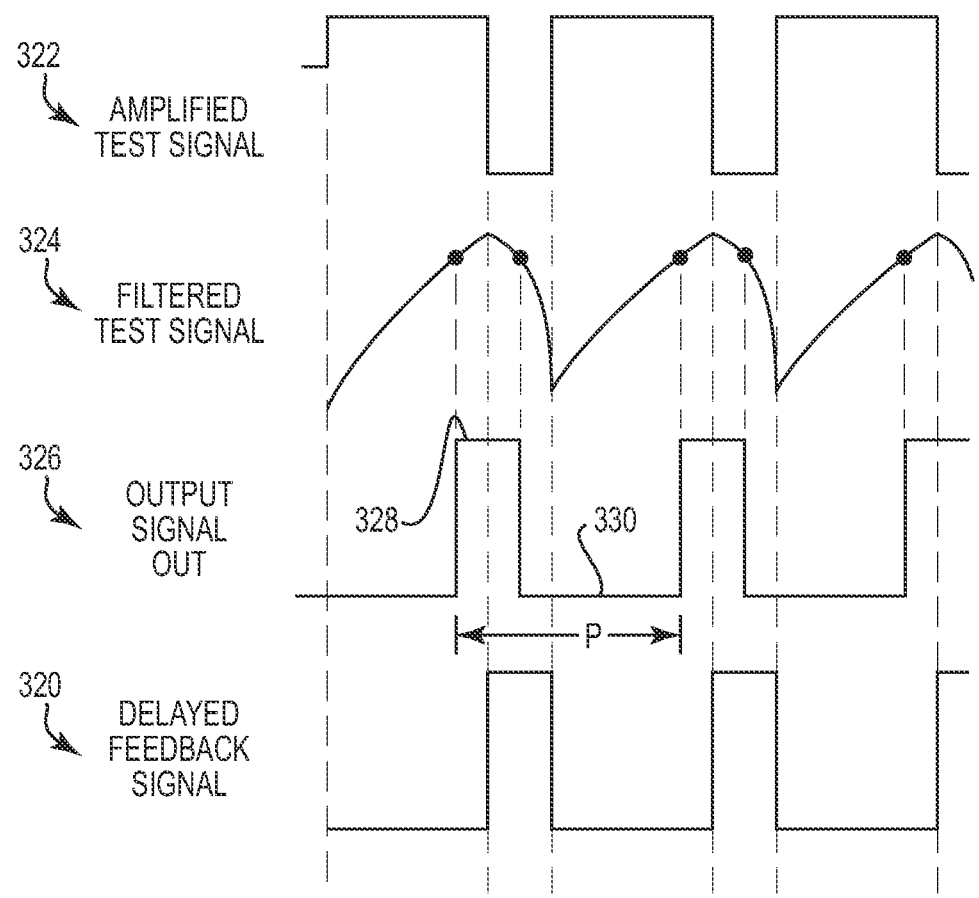
FIG. 6 is a timing diagram illustrating a sensor malfunctioning during self-test operations.

FIGS. 5 and 6 are timing diagrams illustrating self-test mode operation of one embodiment of sensor 200. In this example, sensor 200 does not include up/down counter 204.

FIG. 5 is a timing diagram illustrating sensor 200 functioning within established limits during self-test mode operation. Digital delay circuit 210 provides the delayed feedback signal at 300, amplifier 232 provides the amplified test signal at 302, low pass filter 234 provides the filtered test signal at 304 and comparator 236 provides the test output signal OUT at 306.

Sensor circuit 231 receives the delayed feedback signal at 300 and switches input signal IN at 237 to generate the oscillation in test output signal OUT at 306. Amplifier 232 receives input signal IN at 237 and provides the amplified test signal at 302, where the delayed feedback signal at 300 and the amplified test signal at 302 are 180 degrees out of phase with one another. Low pass filter 234 receives and filters the amplified test signal at 302 to provide the filtered test signal at 304, which is a triangle shaped wave based on the amplified test signal at 302. Main comparator 236 receives the filtered test signal at 304 and provides the test output signal OUT at 306. Digital delay circuit 210 receives test output signal OUT at 306 and delays the output signal to provide the delayed feedback signal at 300, and the process repeats with sensor circuit 231 receiving the delayed feedback signal at 300 and switching input signal IN at 237.

Digital logic circuit 208 receives test output signal OUT at 306 and measures the characteristics of test output signal OUT at 306. If the characteristics of test output signal OUT at 306 are outside the established limits, digital logic circuit 208 reports the failure or malfunctioning of sensor 200. In one embodiment, digital logic circuit 208 measures characteristics such as amplitude, frequency, duty cycle, and jitter of test output signal OUT at 306. In one embodiment, digital logic circuit 208 measures one or more characteristics, such as the root-mean-square (RMS) of amplitude, amplitude crest, amplitude peak, frequency, frequency components, phase differences in signals, duty cycle, jitter, offset, and switching pulses. In one embodiment, the filtered test signal at 304 is received by digital logic circuit 208 and the amplitude of the filtered test signal at 304 is analyzed to determine whether amplifier 232 and low pass filter 234 are operating within established limits.

FIG. 6 is a timing diagram illustrating sensor 200 malfunctioning during self-test mode operation. Digital delay circuit 210 provides the delayed feedback signal at 320, amplifier 232 provides the amplified test signal at 322, low pass filter 234 provides the filtered test signal at 324 and comparator 236 provides the test output signal OUT at 326.

Comparator 236 has an offset problem, such that output signal OUT at 326 has a high phase at 328 that is smaller than 50% of the period P and a low phase at 330 that is larger than 50% of the period P. Also, the frequency of output signal OUT at 326 is slower than the frequency of output signal OUT at 306 in FIG. 5. Thus, the duty cycle and the frequency of output signal OUT at 326 are affected by the offset problem of comparator 236.

Digital delay circuit 210 receives test output signal OUT at 326 and delays the output signal to provide the delayed feedback signal at 320. Sensor circuit 231 receives the delayed feedback signal at 320 and switches input signal IN at 237 to generate the oscillation in test output signal OUT at 326. Amplifier 232 receives input signal IN at 237 and provides the amplified test signal at 322, where the delayed feedback signal at 320 and the amplified test signal at 322 are 180 degrees out of phase with one another. Low pass filter 234 receives and filters the amplified test signal at 322 to provide the filtered test signal at 324, which is a triangle shaped wave based on the amplified test signal at 322. Main comparator 236 receives the filtered test signal at 324 and comparator 236, with the offset problem, provides test output signal OUT at 326. This test output signal OUT at 326 has a duty cycle that is less than 50% and a frequency that is different then the frequency of test output signal OUT at 306 in FIG. 5. The process repeats with digital delay circuit 210 receiving test output signal OUT at 326 and delaying the output signal to provide the delayed feedback signal at 320, and so on.

Digital logic circuit 208 receives test output signal OUT at 326 and measures characteristics of test output signal OUT at 326. For example, digital logic circuit 208 measures the duty cycle and the frequency of test output signal OUT at 320. If the characteristics of test output signal OUT at 326 are outside established limits, digital logic circuit 208 reports the failure or malfunctioning of sensor 200. In one embodiment, digital logic circuit 208 measures characteristics such as amplitude, frequency, duty cycle, and jitter of test output signal OUT at 218. In one embodiment, digital logic circuit 208 measures one or more characteristics, such as the root-mean-square (RMS) of amplitude, amplitude crest, amplitude peak, frequency, frequency components, phase differences in signals, duty cycle, jitter, offset, and switching pulses. In one embodiment, the filtered test signal at 304 is received by a circuit, such as digital logic circuit 208, and the amplitude of the filtered test signal at 304 is analyzed to determine whether amplifier 232 and low pass filter 234 are operating within functional limits.

Figure 7:
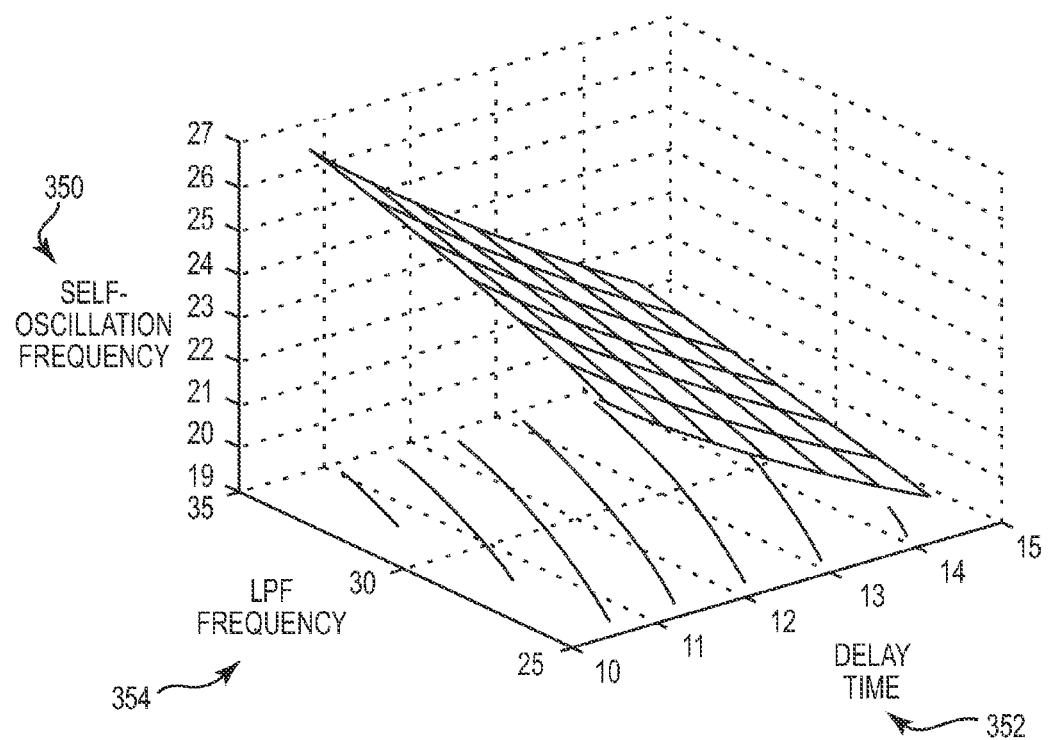
FIG. 7 is a graph illustrating self-oscillation frequency, delay time and low pass filter frequency in one embodiment of a sensor.

FIG. 7 is a graph illustrating the self-oscillation frequency at 350, delay time at 352 and low pass filter (LPF) frequency at 354 in one embodiment of sensor 200 of FIG. 3. Clock generator 214 clocks digital delay circuit 210 via the clock signal at 226, where the frequency of the clock signal at 226 corresponds to the delay time at 352. Digital delay circuit 210 provides the delay time at 352 based on the frequency of the clock signal at 226. As the delay time at 352 decreases, the self-oscillation frequency at 350 increases. Also, as the LPF frequency at 354 provided via low pass filter 234 increases, the self-oscillation frequency at 350 increases. In one embodiment, the delay time through analog circuit 206 is on the same order of magnitude as the delay time at 352 through digital delay circuit 210. In one embodiment, the delay time through low pass filter 234 is on the same order of magnitude as the delay time at 352 through digital delay circuit 210.

The self-oscillation frequency at 350, delay time 352 and LPF frequency at 354 change with technological variations, such as process and temperature variations. In one embodiment, digital logic circuit 208 measures the frequency of the clock signal at 226, or alternatively the frequency of the clock signal at 224, to obtain information about technological variations. In one embodiment, digital logic circuit 208 measures the delay time, such as the delay time at 352 through digital delay circuit 210 or the delay time through low pass filter 234, to obtain information about technological variations.

Figure 8:
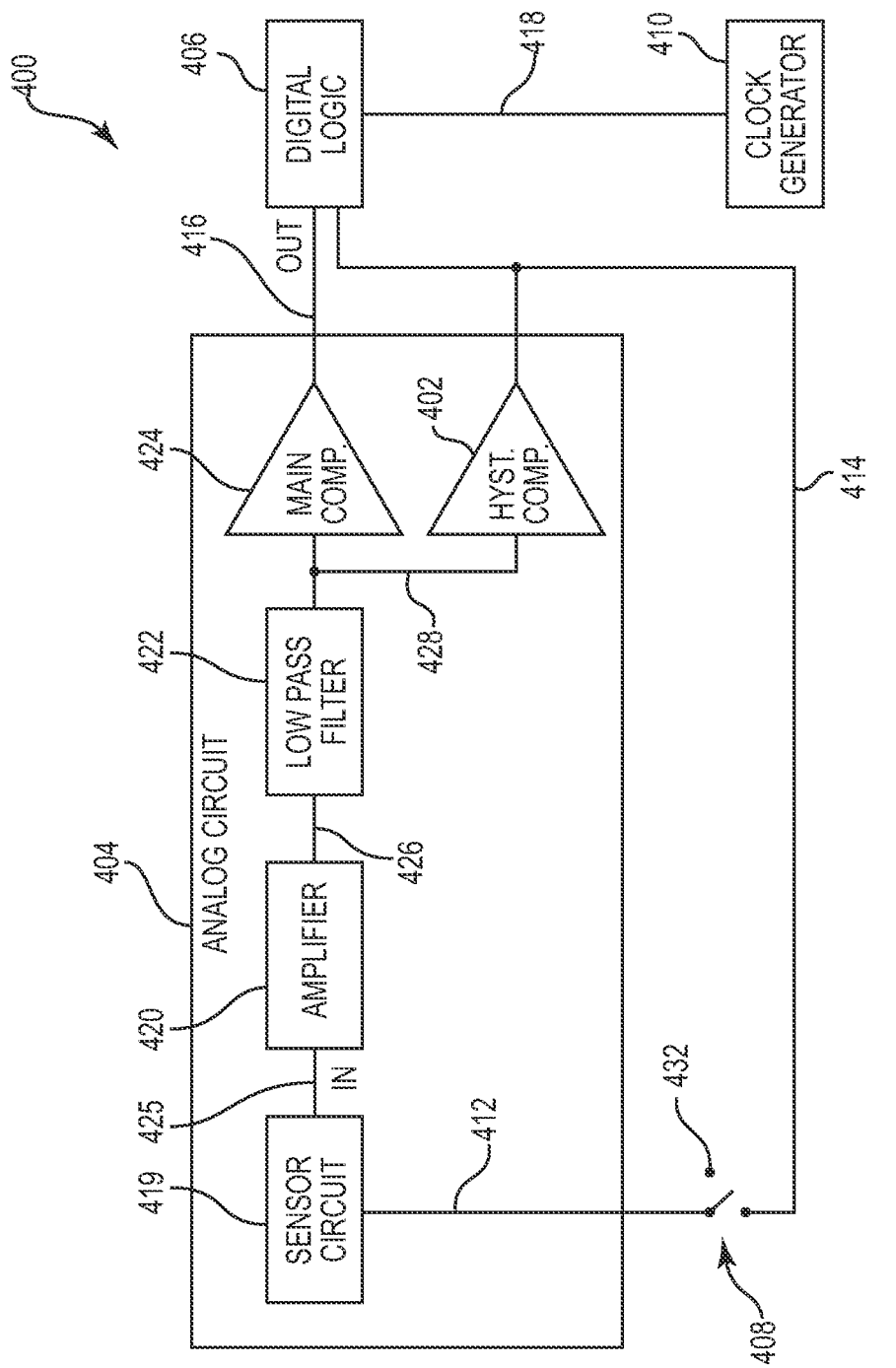
FIG. 8 is a diagram illustrating one embodiment of a sensor that includes a hysteresis comparator.

FIG. 8 is a diagram illustrating one embodiment of a sensor 400 that includes a hysteresis comparator 402. Sensor 400 performs normal mode operations and self-test mode operations that test analog circuit 404. In one embodiment, sensor 400 is similar to system 200. In one embodiment, sensor 400 is similar to system 100. In one embodiment, sensor 400 is similar to system 20. In one embodiment, sensor 400 performs self-tests to meet manufacturing goals and safety objectives, such as zero defect manufacturing goals and SIL goals. In one embodiment, sensor 400 performs self-tests at one or more of production testing, power-up and other selected times in the application.

Sensor 400 includes analog circuit 404, digital logic circuit 406, switch 408 and clock generator 410. Analog circuit 404 is electrically coupled to switch 408 via feedback input path 412 and hysteresis feedback path 414. Analog circuit 404 is electrically coupled to digital logic circuit 406 via hysteresis feedback path 414 and comparator output path 416. Clock generator 410 is electrically coupled to digital logic circuit 406 via clock path 418 and provides a clock signal to digital logic circuit 406 via clock path 418.

The components of sensor 400, including analog circuit 404, digital logic circuit 406, switch 408 and clock generator 410, communicate with one another to perform sensor operations. In one embodiment, all of these components are on one integrated circuit chip. In other embodiments, one or more of these components are on other integrated circuit chips.

Analog circuit 404 includes hysteresis comparator 402, sensor circuit 419, amplifier 420, low pass filter 422 and main comparator 424. Sensor circuit 419 is electrically coupled to switch 408 via feedback input path 412. Amplifier 420 is electrically coupled to sensor circuit 419 via input path 425 and to low pass filter 422 via amplifier output path 426. The output of low pass filter 422 is electrically coupled to main comparator 424 and hysteresis comparator 402 via filtered output path 428. Main comparator 424 is electrically coupled to digital logic circuit 406 via comparator output path 416, and hysteresis comparator 402 is electrically coupled to digital logic circuit 406 and switch 408 via hysteresis feedback path 414.

Sensor 400 functions in normal mode operation and self-test mode operation. In normal mode operation, sensor 400 controls switch 408 to switch feedback input path 412 to an open state at 432. In self-test mode operation, sensor 400 controls switch 408 to switch feedback input path 412 to the output at 414 of hysteresis comparator 402. Sensor 400 controls switch 408 via control logic (not shown for clarity) to switch feedback input path 412 between the open state at 432 and the output at 414. In one embodiment, switch 408 is coupled to a reference, such as ground, at 432.

Sensor circuit 419 functions in normal mode operation and self-test mode operation. In normal mode operation, sensor circuit 419 senses events and provides a sensed signal at 425 that corresponds to the sensed events. In self-test mode operation, sensor circuit 419 receives a hysteresis feedback signal at 414 via feedback input path 412 and provides input signal IN at 425, which generates an oscillation in test output signal OUT at 416. In one embodiment, sensor circuit 419 includes magnetic sensing elements. In one embodiment, sensor circuit 419 includes XMR sensing elements. In one embodiment, sensor circuit 419 includes Hall effect sensing elements. In one embodiment, sensor circuit 419 is an optical sensor circuit. In one embodiment, sensor circuit 419 is an inductive sensor circuit. In one embodiment, sensor circuit 419 is a capacitive sensor circuit. In one embodiment, sensor circuit 419 is a resistive sensor circuit.

Analog circuit 404 functions in normal mode operation and self-test mode operation. In normal mode operation, amplifier 420 receives the sensed signal at 425 and provides an amplified sensed signal to low pass filter 422 via amplifier output path 426. Low pass filter 422 receives and filters the amplified sensed signal at 426 and provides a filtered sensed signal to main comparator 424 and to hysteresis comparator 402 via filtered output path 428. Main comparator 424 receives the filtered sensed signal at 428 and provides a sensed output signal to digital logic circuit 406 via comparator output path 416. Hysteresis comparator 402 receives the filtered sensed signal at 428 and provides a hysteresis output signal to digital logic circuit 406 via hysteresis feedback path 414.

In self-test mode operation, amplifier 420 receives input signal IN at 425 and provides an amplified test signal to low pass filter 422 via amplifier output path 426. Low pass filter 422 receives and filters the amplified test signal at 426 and provides a filtered test signal to main comparator 424 and to hysteresis comparator 402 via filtered output path 428. Main comparator 424 receives the filtered test signal at 428 and provides test output signal OUT at 416. Hysteresis comparator 402 receives the filtered test signal at 428 and provides a hysteresis feedback signal at 414. Sensor circuit 419 receives the hysteresis feedback signal at 414 and switches input signal IN at 425 based on the hysteresis feedback signal at 414, which generates the oscillation in test output signal OUT at 416. In one embodiment, the input signals at 425, the amplified signals at 426 and the filtered signals at 428 are differential signals.

Digital logic circuit 406 functions in normal mode operation and self-test mode operation. In normal mode operation, digital logic circuit 406 receives the sensed output signal at 416 and the hysteresis output signal at 414 and provides an output signal to other circuits. The output signals correspond to the sensed signals from sensor circuit 419. In self-test mode operation, digital logic circuit 406 receives and measures characteristics of test output signal OUT at 416 and/or other signals from analog circuit 404. If the characteristics of test output signal OUT at 416 and/or the other signals are outside established limits, analog circuit 404 and/or sensor circuit 419 are/is not functioning within established limits and digital logic circuit 406 reports an error or the malfunctioning of sensor 400. In one embodiment, digital logic circuit 406 receives and measures characteristics of the hysteresis feedback signal at 414. In one embodiment, digital logic circuit 406 measures characteristics such as amplitude, frequency, duty cycle, and jitter. In one embodiment, digital logic circuit 406 measures one or more characteristics, such as the root-mean-square (RMS) of amplitude, amplitude crest, amplitude peak, frequency, frequency components, phase differences in signals, duty cycle, jitter, offset, and switching pulses. In one embodiment, a circuit, such as digital logic circuit 406, receives the filtered test signal at 428 and the amplitude of the filtered test signal at 428 is analyzed to determine whether amplifier 420 and low pass filter 422 are operating within established limits. In one embodiment, digital logic circuit 406 controls switch 408 to switch between normal mode operation and self-test mode operation.

In normal mode operation of sensor 400, sensor circuit 419 senses events and provides a sensed signal at 425 that corresponds to the sensed events. Amplifier 420 receives the sensed signal at 425 and provides an amplified sensed signal at 426. Low pass filter 422 receives and filters the amplified sensed signal at 426 and provides a filtered sensed signal at 428. Main comparator 424 and hysteresis comparator 402 receive the filtered sensed signal at 428. Main comparator 424 provides a sensed output signal at 416 and hysteresis comparator 402 provides a hysteresis output signal at 414. Digital logic circuit 406 receives the sensed output signal at 416 and the hysteresis output signal at 414 and provides an output signal to other circuits, where the output signals correspond to the sensed signals from sensor circuit 419.

In self-test mode operation, sensor 400 generates an oscillating test output signal OUT at 416 and an oscillating hysteresis feedback signal at 414. Sensor 400 measures characteristics of test output signal OUT at 416 to test analog circuit 404. In one embodiment, sensor 400 measures characteristics of the hysteresis feedback signal at 414 to test analog circuit 404. In one embodiment, sensor 400 measures characteristics of test output signal OUT at 416 and hysteresis feedback signal at 414 to test analog circuit 404.

In self-test mode operation, sensor circuit 419 receives the hysteresis feedback signal at 414 and switches input signal IN at 425 to generate the oscillation in test output signal OUT at 416 and the hysteresis feedback signal at 414. Amplifier 420 receives input signal IN at 425 and provides an amplified test signal at 426. Low pass filter 422 receives and filters the amplified test signal at 426 and provides a filtered test signal at 428. Main comparator 424 receives the filtered test signal at 428 and provides the test output signal OUT at 416. Hysteresis comparator 402 receives the filtered test signal at 428 and provides the hysteresis feedback signal at 414. Sensor circuit 419 receives the hysteresis feedback signal at 414 and switches input signal IN at 425 and the sequence repeats. Digital logic circuit 406 receives test output signal OUT at 416 and measures characteristics of test output signal OUT at 416. If the characteristics of test output signal OUT at 416 and/or other signals from analog circuit 404 are outside established limits, analog circuit 404 and/or sensor circuit 419 are/is not functioning within established limits and digital logic circuit 406 reports the failure or malfunctioning of sensor 400. In one embodiment, digital logic circuit 406 receives and measures characteristics of the hysteresis feedback signal at 414. In one embodiment, digital logic circuit 406 receives and measures characteristics of test output signal OUT at 416 and hysteresis feedback signal at 414 to test analog circuit 404.

Figure 9:
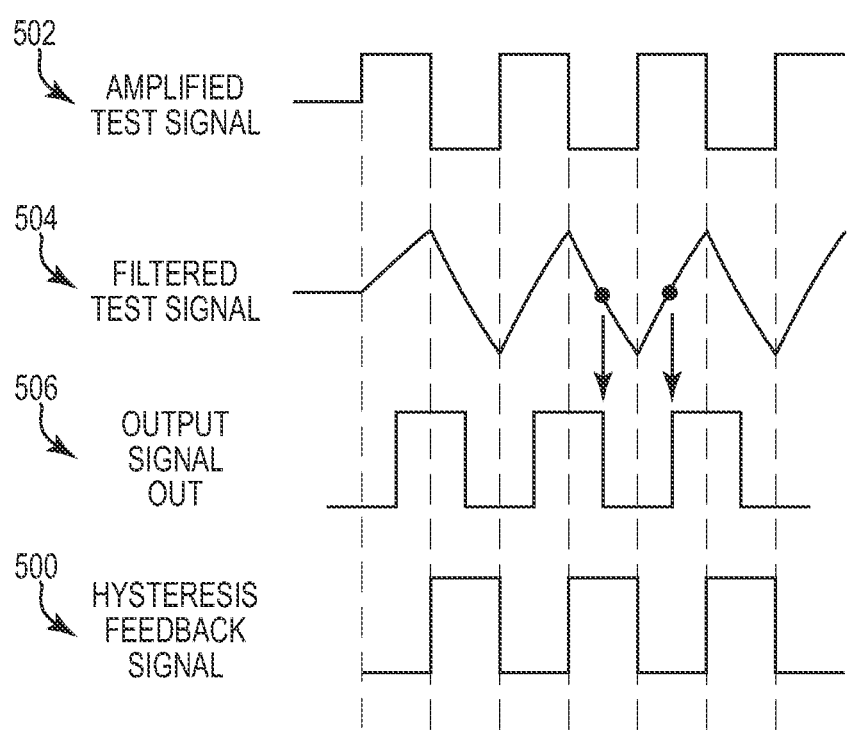
FIG. 9 is a timing diagram illustrating the sensor of FIG. 8 functioning within established limits during self-test operations.
Figure 10:
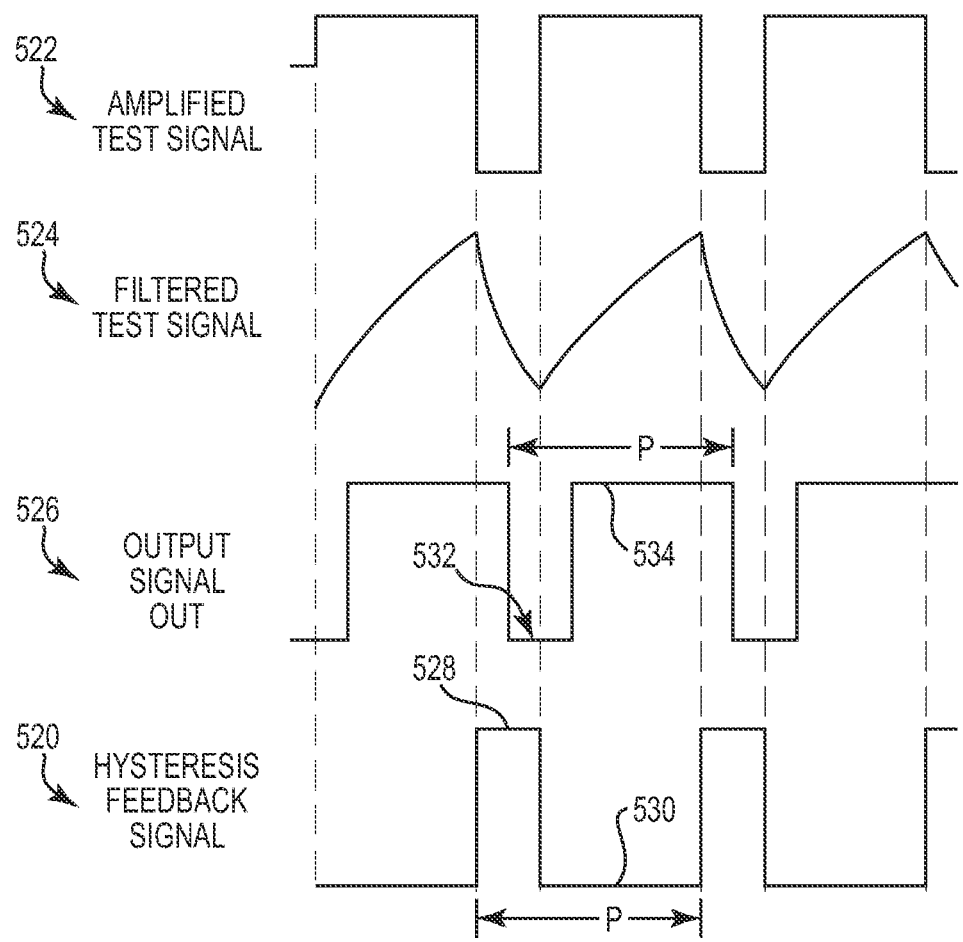
FIG. 10 is a timing diagram illustrating the sensor of FIG. 8 malfunctioning during self-test operations.
Figure 11:
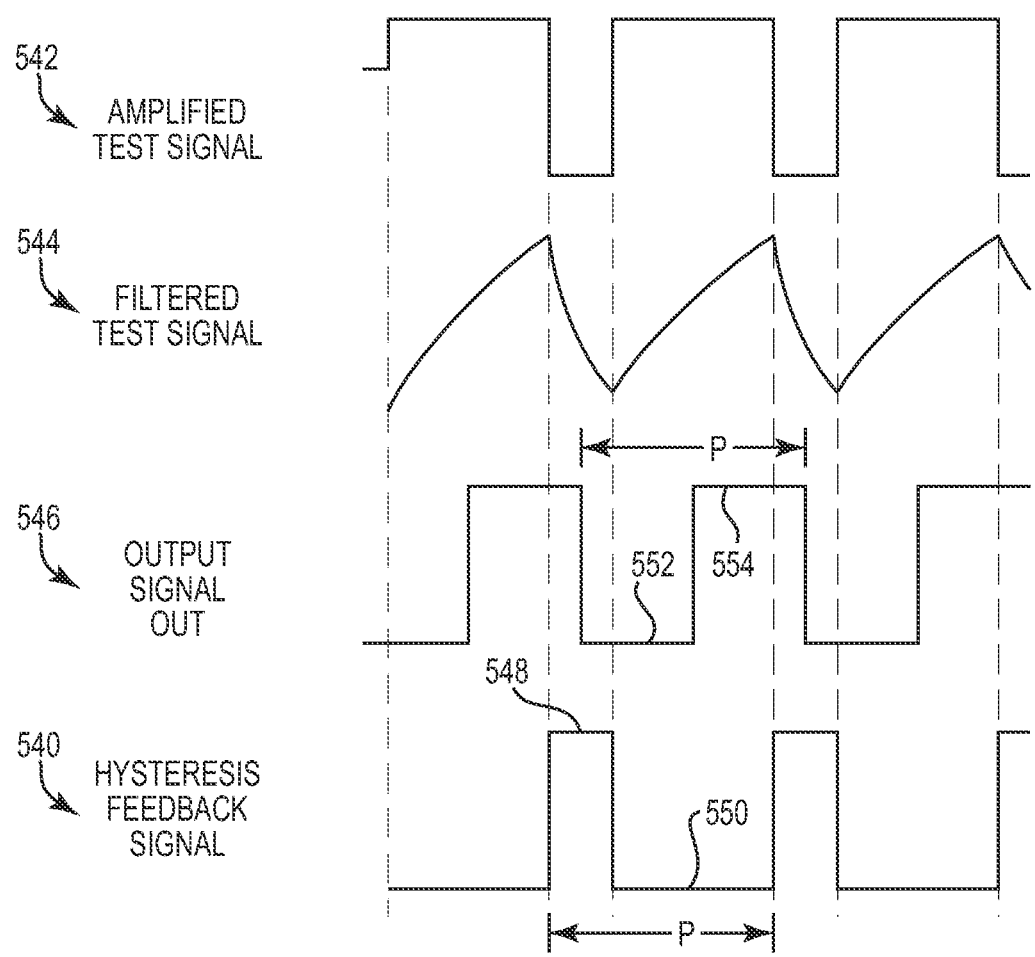
FIG. 11 is a timing diagram illustrating the sensor of FIG. 8 malfunctioning during self-test operation, where both the hysteresis comparator and the main comparator have offset problems.

FIGS. 9, 10 and 11 are timing diagrams illustrating self-test mode operation of one embodiment of sensor 400.

FIG. 9 is a timing diagram illustrating sensor 400 functioning within established limits during self-test mode operation. Hysteresis comparator 402 provides the hysteresis feedback signal at 500, amplifier 420 provides the amplified test signal at 502, low pass filter 422 provides the filtered test signal at 504 and main comparator 424 provides the test output signal OUT at 506. In one embodiment, the duty cycle of output signal OUT at 506 is 50%.

Sensor circuit 419 receives the hysteresis feedback signal at 500 and switches input signal IN at 425 to generate the oscillation in test output signal OUT at 506. Amplifier 420 receives input signal IN at 425 and provides the amplified test signal at 502, where the hysteresis feedback signal at 500 and the amplified test signal at 502 are 180 degrees out of phase with one another. Low pass filter 422 receives and filters the amplified test signal at 502 to provide the filtered test signal at 504, which is a triangle shaped wave based on the amplified test signal at 502. Main comparator 424 receives the filtered test signal at 504 and provides the test output signal OUT at 506. Hysteresis comparator 402 receives the filtered test signal at 504 and provides the hysteresis feedback signal at 500.

The process repeats with sensor circuit 419 receiving the hysteresis feedback signal at 500 and switching input signal IN at 425.

Digital logic circuit 406 receives test output signal OUT at 506 and measures the characteristics of test output signal OUT at 506. If the characteristics of test output signal OUT at 506 are outside the established limits, digital logic circuit 406 reports the failure or malfunctioning of sensor 400. In one embodiment, digital logic circuit 406 measures characteristics such as amplitude, frequency, duty cycle, and jitter of test output signal OUT at 506. In one embodiment, digital logic circuit 406 measures one or more characteristics, such as the root-mean-square (RMS) of amplitude, amplitude crest, amplitude peak, frequency, frequency components, phase differences in signals, duty cycle, jitter, offset, and switching pulses. In one embodiment, the filtered test signal at 504 is received by digital logic circuit 406 and the amplitude of the filtered test signal at 504 is analyzed to determine whether amplifier 420 and low pass filter 422 are operating within established limits.

FIG. 10 is a timing diagram illustrating sensor 400 malfunctioning during self-test mode operation. Hysteresis comparator 402 provides the hysteresis feedback signal at 520, amplifier 420 provides the amplified test signal at 522, low pass filter 422 provides the filtered test signal at 524 and main comparator 424 provides the test output signal OUT at 526.

In this example, hysteresis comparator 402 has an offset problem, such that hysteresis comparator 402 switches with the filtered test signal at 524 at higher values than the values reached when hysteresis comparator 402 does not have an offset problem. This provides a hysteresis feedback signal at 520 that has a high phase at 528 that is smaller than 50% of the period P and a low phase at 530 that is larger than 50% of the period P. Also, this results in a test output signal OUT at 526 that has a low phase at 532 that is smaller than 50% of the period P and a high phase at 534 that is larger than 50% of the period P. In addition, the frequency of output signal OUT at 526 is slower than the frequency of output signal OUT at 506 in FIG. 5. Thus, the duty cycle and the frequency of output signal OUT at 526 are affected by the offset problem of hysteresis comparator 402.

Hysteresis comparator 402 receives the filtered test signal at 524 and provides the hysteresis feedback signal at 520, such that hysteresis comparator 402 switches when the filtered test signal at 524 reaches higher values than the values reached if hysteresis comparator 402 does not have an offset problem. Sensor circuit 419 receives the hysteresis feedback signal at 520 and switches input signal IN at 425. Amplifier 420 receives input signal IN at 425 and provides the amplified test signal at 522, where the hysteresis feedback signal at 520 and the amplified test signal at 522 are 180 degrees out of phase with one another. Low pass filter 422 receives and filters the amplified test signal at 522 to provide the filtered test signal at 524, which is the triangle shaped wave at higher values based on the amplified test signal at 522. Main comparator 424 receives the filtered test signal at 524 and main comparator 424 provides test output signal OUT at 526. This test output signal OUT at 526 has a duty cycle that is greater than 50% and a frequency that is different then the frequency of test output signal OUT at 506 in FIG. 5. The process repeats with hysteresis comparator 402 providing the hysteresis feedback signal at 520, and so on.

Digital logic circuit 406 receives test output signal OUT at 526 and measures characteristics of test output signal OUT at 526. For example, digital logic circuit 406 measures the duty cycle and the frequency of test output signal OUT at 526. If the characteristics of test output signal OUT at 526 are outside established limits, digital logic circuit 406 reports the failure or malfunctioning of sensor 400. In one embodiment, digital logic circuit 406 measures characteristics such as amplitude, frequency, duty cycle, and jitter of test output signal OUT at 526. In one embodiment, digital logic circuit 406 measures one or more characteristics, such as the root-mean-square (RMS) of amplitude, amplitude crest, amplitude peak, frequency, frequency components, phase differences in signals, duty cycle, jitter, offset, and switching pulses. In one embodiment, the filtered test signal at 524 is received by a circuit, such as digital logic circuit 406, and the amplitude of the filtered test signal at 524 is analyzed to determine whether amplifier 420 and low pass filter 422 are operating within functional limits.

FIG. 11 is a timing diagram illustrating sensor 400 malfunctioning during self-test mode operation, where both hysteresis comparator 402 and main comparator 424 have offset problems. Hysteresis comparator 402 provides the hysteresis feedback signal at 540, amplifier 420 provides the amplified test signal at 542, low pass filter 422 provides the filtered test signal at 544 and main comparator 424 provides the test output signal OUT at 546.

In this example, hysteresis comparator 402 has an offset problem, such that hysteresis comparator 402 switches with the filtered test signal at 544 at higher values than the values reached when hysteresis comparator 402 does not have an offset problem. This provide a hysteresis feedback signal at 540 that has a high phase at 548 that is smaller than 50% of the period P and a low phase at 550 that is larger than 50% of the period P. Also, main comparator 424 has an offset problem such that test output signal OUT at 546 has a low phase at 552 that is slightly larger than 50% of the period P and a high phase at 554 that is slightly smaller than 50% of the period P. In addition, the frequency of output signal OUT at 546 is slower than the frequency of output signal OUT at 506 in FIG. 5. Thus, the duty cycle and the frequency of output signal OUT at 546 are changed by the offset problems of hysteresis comparator 402 and main comparator 424.

Hysteresis comparator 402 receives the filtered test signal at 544 and provides the hysteresis feedback signal at 540, such that hysteresis comparator 402 switches when the filtered test signal at 544 reaches higher values than the values reached if hysteresis comparator 402 does not have an offset problem. Sensor circuit 419 receives the hysteresis feedback signal at 540 and switches input signal IN at 425. Amplifier 420 receives input signal IN at 425 and provides the amplified test signal at 542, where the hysteresis feedback signal at 540 and the amplified test signal at 542 are 180 degrees out of phase with one another. Low pass filter 422 receives and filters the amplified test signal at 542 to provide the filtered test signal at 544, which is the triangle shaped wave at higher values based on the amplified test signal at 542. Main comparator 424 receives the filtered test signal at 544 and provides test output signal OUT at 546. This test output signal OUT at 546 has a duty cycle that is less than 50% and a frequency that is different then the frequency of test output signal OUT at 506 in FIG. 5. The process repeats with hysteresis comparator 402 providing the hysteresis feedback signal at 540, and so on.

Digital logic circuit 406 receives test output signal OUT at 546 and measures characteristics of test output signal OUT at 546. For example, digital logic circuit 406 measures the duty cycle and the frequency of test output signal OUT at 546. If the characteristics of test output signal OUT at 546 are outside established limits, digital logic circuit 406 reports the failure or malfunctioning of sensor 400. In one embodiment, digital logic circuit 406 measures characteristics such as amplitude, frequency, duty cycle, and jitter of test output signal OUT at 546. In one embodiment, digital logic circuit 406 measures one or more characteristics, such as the root-mean-square (RMS) of amplitude, amplitude crest, amplitude peak, frequency, frequency components, phase differences in signals, duty cycle, jitter, offset, and switching pulses. In one embodiment, the filtered test signal at 544 is received by a circuit, such as digital logic circuit 406, and the amplitude of the filtered test signal at 544 is analyzed to determine whether amplifier 420 and low pass filter 422 are operating within functional limits.

Figure 12:
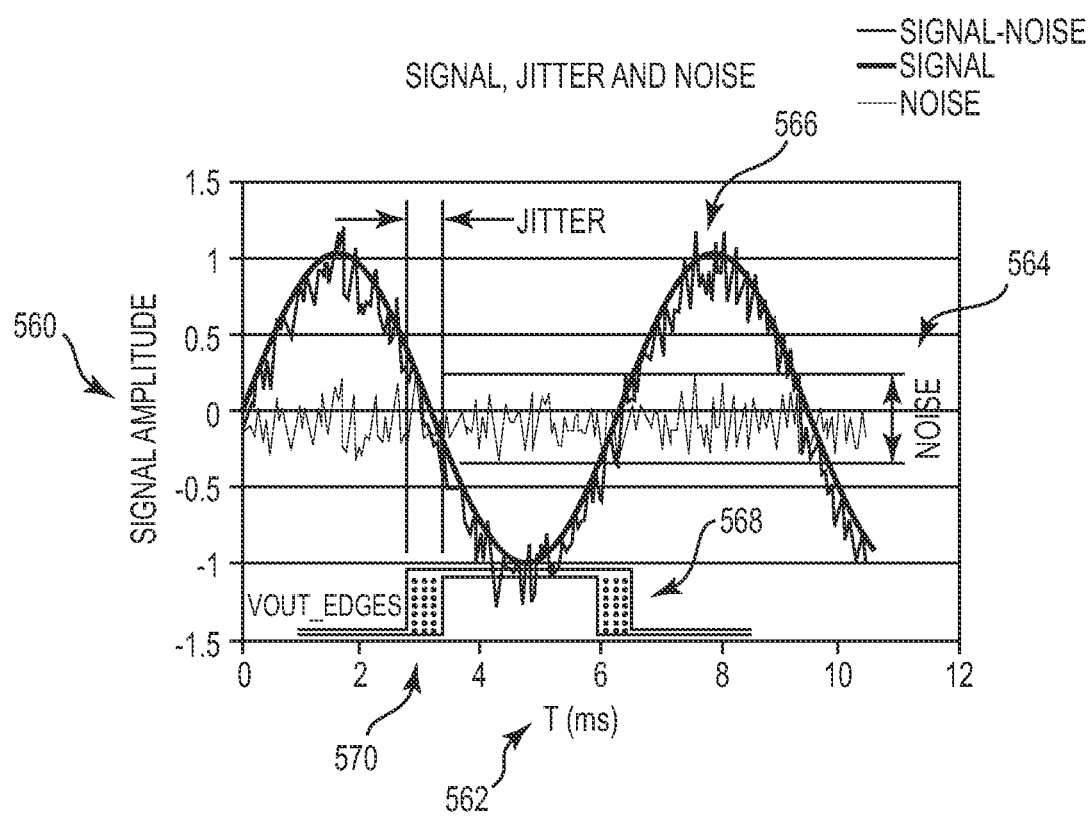
FIG. 12 is a diagram illustrating the generation of jitter in a sensor.

FIG. 12 is a diagram illustrating the correlation between noise and jitter depending on signal slope in sensor 400. Signal amplitude at 560 is plotted versus time T in milliseconds (ms) at 562.

Noise at 564 is introduced into sensor 400 and added to the signal at 566. The signal at 566 is received by a circuit, such as a comparator, that produces a digital output signal at 568. The edges of the digital output signal at 568 include jitter at 570 based on switching the circuit with the noise laden signal at 566. In one embodiment, the noise at 564 is introduced into sensor 400 via analog circuit 404 and components such as amplifier 420 and low pass filter 422. In one embodiment, the signal at 566 is the filtered test signal provided via low pass filter 422 and main comparator 424 receives the filtered test signal at 566 and provides the digital output signal at 568, which can be checked to determine whether sensor 400 is operating within established limits, including noise and jitter limits. In one embodiment, the signal at 566 is received by a circuit, such as a comparator, that produces the digital output signal at 568 and the digital output signal at 568 includes switching pulses at 570 based on switching the circuit with the noise laden signal at 566.

Figure 13:
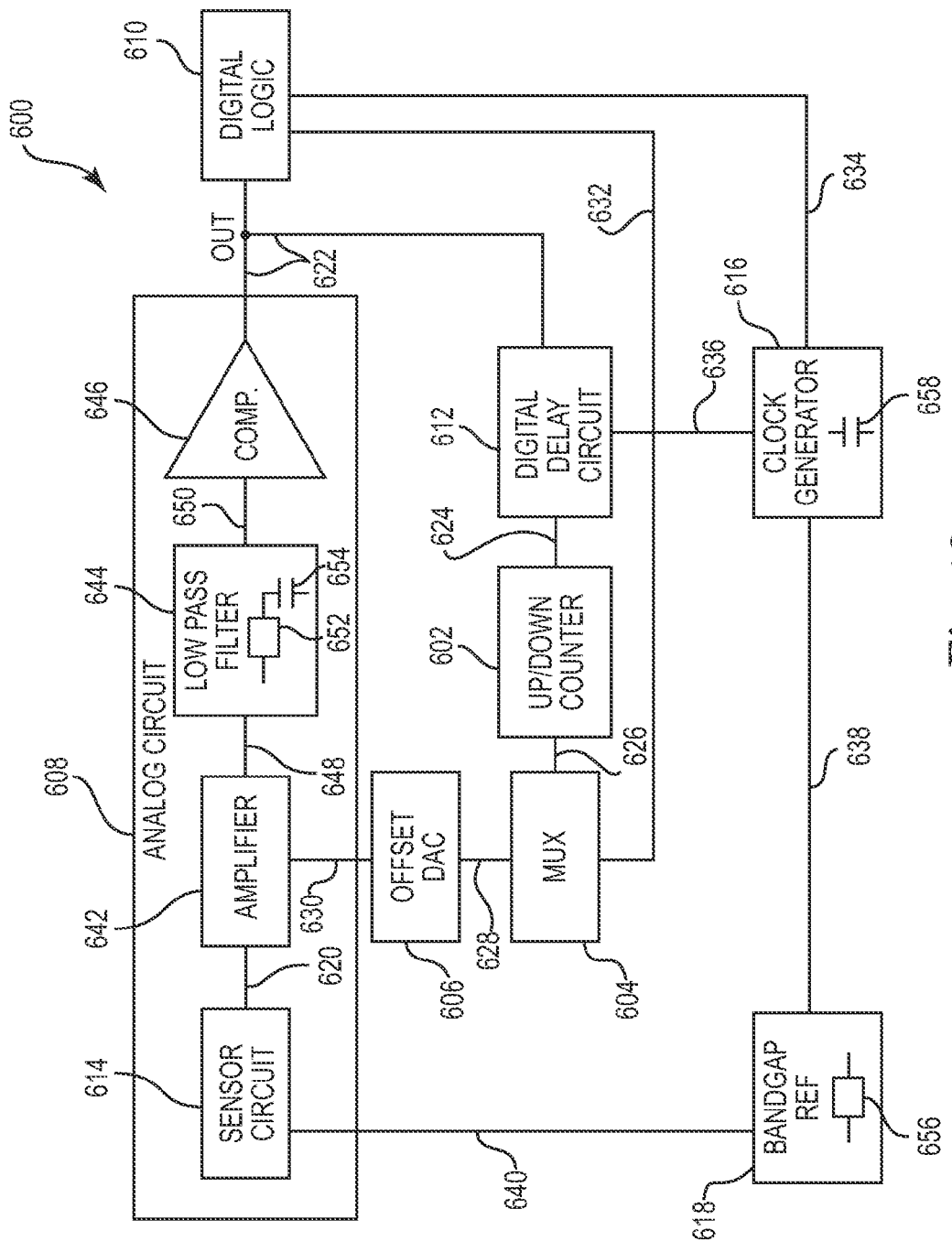
FIG. 13 is a diagram illustrating one embodiment of a sensor that includes an up/down counter, a multiplexer and an offset digital-to-analog converter (DAC).

FIG. 13 is a diagram illustrating one embodiment of a sensor 600 that includes an up/down counter 602, a multiplexer 604 and an offset DAC 606. Sensor 600 performs normal mode operations and self-test mode operations that test analog circuit 608. In one embodiment, sensor 600 is similar to system 200. In one embodiment, sensor 600 is similar to system 100. In one embodiment, sensor 600 is similar to system 20. In one embodiment, sensor 600 performs self-tests to meet manufacturing goals and safety objectives, such as zero defect manufacturing goals and SIL goals. In one embodiment, sensor 600 performs self-tests at one or more of production testing, power-up and other selected times in the application.

Sensor 600 includes up/down counter 602, multiplexer 604, offset DAC 606 and analog circuit 608. Sensor 600 also includes digital logic circuit 610, digital delay circuit 612, clock generator 616 and bandgap reference 618. Analog circuit 608 is electrically coupled to digital logic circuit 610 and digital delay circuit 612 via first feedback path 622. Digital delay circuit 612 is electrically coupled to up/down counter 602 via second feedback path 624. Up/down counter 602 is electrically coupled to an input of multiplexer 604 via third feedback path 626. The output of multiplexer 604 is electrically coupled to offset DAC 606 via fourth feedback path 628 and offset DAC 606 is electrically coupled to analog circuit 608 via fifth feedback path 630. Digital logic circuit 610 is electrically coupled to another input of multiplexer 604 via offset feedback path 632.

Clock generator 616 is electrically coupled to digital logic circuit 610 via first clock path 634 and to digital delay circuit 612 via second clock path 636. Also, clock generator 616 is electrically coupled to bandgap reference 618 via first bandgap path 638 and bandgap reference 618 is electrically coupled to analog circuit 608 via second bandgap path 640.

The components of sensor 600, including up/down counter 602, multiplexer 604, offset DAC 606, analog circuit 608, digital logic circuit 610, digital delay circuit 612, clock generator 616 and bandgap reference 618 communicate with one another to perform sensor operations. In one embodiment, all of these components are on one integrated circuit chip. In other embodiments, one or more of these components are on other integrated circuit chips.

Analog circuit 608 includes sensor circuit 614, an amplifier 642, a low pass filter 644 and a main comparator 646. Sensor circuit 614 is electrically coupled to bandgap reference 618 via second bandgap path 640. Amplifier 642 is electrically coupled to sensor circuit 614 via input path 620 and to low pass filter 644 via amplifier output path 648. Main comparator 646 is electrically coupled to low pass filter 644 via filtered output path 650 and to digital logic circuit 610 and delay circuit 612 via first feedback path 622.

Sensor circuit 614 functions in normal mode operation. In normal mode operation, sensor circuit 614 senses events and provides a sensed signal at 620 that corresponds to the sensed events. In one embodiment, sensor circuit 620 includes magnetic sensing elements. In one embodiment, sensor circuit 620 includes XMR sensing elements. In one embodiment, sensor circuit 620 includes Hall effect sensing elements. In one embodiment, sensor circuit 620 includes Hall effect sensing elements and bandgap reference 618 is used to set the current that flows through the Hall sensing elements. In one embodiment, sensor circuit 614 is an optical sensor circuit. In one embodiment, sensor circuit 614 is an inductive sensor circuit. In one embodiment, sensor circuit 614 is a capacitive sensor circuit. In one embodiment, sensor circuit 614 is a resistive sensor circuit.

Analog circuit 608 functions in normal mode operation and self-test mode operation. In normal mode operation, amplifier 642 receives the sensed signal at 620 and provides an amplified sensed signal to low pass filter 644 via amplifier output path 648. Low pass filter 644 receives and filters the amplified sensed signal at 648 and provides a filtered sensed signal to main comparator 646 via filtered output path 650. Main comparator 646 receives the filtered sensed signal at 650 and provides a sensed output signal to digital logic circuit 610 via first feedback path 622. Digital logic circuit 610 provides an offset feedback signal to offset DAC 606 via offset feedback path 632, multiplexer 604 and fourth feedback path 628. An offset signal from offset DAC 606 is received by amplifier 642 via fifth feedback path 630.

In self-test mode operation, amplifier 642 receives a test offset signal from offset DAC 606 via fifth feedback path 630 and provides an amplified test signal to low pass filter 644 via amplifier output path 648. Low pass filter 644 receives and filters the amplified test signal at 648 and provides a filtered test signal to main comparator 646 via filtered output path 650. Main comparator 646 receives the filtered test signal at 650 and provides test output signal OUT at 622. In one embodiment, the amplified signals at 648 and the filtered signals at 650 are differential signals.

Digital delay circuit 612 and up/down counter 602 function in self-test mode operation. Digital delay circuit 612 receives test output signal OUT at 622 and a clock signal from clock generator 616 via second clock path 636. Digital delay circuit 612 uses the clock signal at 636 to delay test output signal OUT at 622 and provide a delayed feedback signal at 624. Up/down counter 602 receives the delayed feedback signal at 624 and provides a count in a delayed feedback signal to offset DAC 606 via multiplexer 604 and fourth feedback path 628. Up/down counter 602 counts up and down based on the delayed feedback signal at 624 to obtain the count value.

Offset DAC 606 receives the count in the delayed feedback signal at 628 and provides the test offset signal to amplifier 642, which generates an oscillation in test output signal OUT at 622. The loop repeats with amplifier 642 receiving the test offset signal at 630 from offset DAC 606 and providing the amplified test signal at 648 to low pass filter 644. In one embodiment, digital delay circuit 612 includes flip-flops that are clocked via the clock signal at 636.

Multiplexer 604 and offset DAC 606 function in normal mode operation and self-test mode operation. In normal mode operation, multiplexer 604 receives an offset feedback signal at 632 from digital logic circuit 610 and provides the offset feedback signal to offset DAC via fourth feedback path 628. Offset DAC 606 receives the offset feedback signal and provides an offset signal to amplifier 642. In self-test mode operation, multiplexer 604 receives a test offset signal at 626 from up/down counter 602 and provides the test offset signal to offset DAC 628 via fourth feedback path 628. Offset DAC 606 receives the test offset signal at 630 and provides an offset signal to amplifier 642.

Digital logic circuit 610 functions in normal mode operation and self-test mode operation. In normal mode operation, digital logic circuit 610 receives the sensed output signal at 622 and provides, to other circuits, an output signal that corresponds to the sensed signals from sensor circuit 614. Also, digital logic circuit 610 provides an offset feedback signal at 632 to multiplexer 604. In self-test mode operation, digital logic circuit 610 receives and measures characteristics of test output signal OUT at 622 and/or other signals from analog circuit 608. If the characteristics of test output signal OUT at 622 and/or the other signals are outside established limits, analog circuit 622 and/or one or more circuits in the feedback path, such as digital delay circuit 612, up/down counter 602 and offset DAC 606, is not functioning properly and digital logic circuit 610 reports an error or the malfunctioning of sensor 600. In one embodiment, digital logic circuit 610 measures characteristics such as amplitude, frequency, duty cycle, and jitter of test output signal OUT at 622. In one embodiment, digital logic circuit 208 measures one or more characteristics, such as the root-mean-square (RMS) of amplitude, amplitude crest, amplitude peak, frequency, frequency components, phase differences in signals, duty cycle, jitter, offset, and switching pulses. In one embodiment, a circuit, such as digital logic circuit 610, receives the filtered test signal at 650 and the amplitude of the filtered test signal at 650 is analyzed to determine whether amplifier 642 and low pass filter 644 are operating within functional limits. In one embodiment, digital logic circuit 610 controls multiplexer 604 to switch between normal mode operation and self-test mode operation.

Clock generator 616 provides a clock signal to digital logic circuit 610 via first clock path 634 and a clock signal to digital delay circuit 612 via second clock path 636. Clock generator 616 uses bandgap reference 618 to provide the clock signal at 636.

Low pass filter 644 includes a first resistor 652 coupled to a first capacitor 654 that provide first resistor and capacitor characteristics over process and temperature variations. Bandgap reference 618 includes a second resistor 656 and clock generator 616 includes a second capacitor 658 that provide second resistor and capacitor characteristics over process and temperature variations. The second resistor and capacitor characteristics match the first resistor and capacitor characteristics over process and temperature variations, such that clock generator 616 changes the frequency of the clock signal at 636, which changes the delay through digital delay circuit 612 and compensates for changes in low pass filter 644. Thus, the duty cycle does not change over process and temperature variations.

In normal mode operation of sensor 600, sensor circuit 614 senses events and provides a sensed signal at 620 that corresponds to the sensed events. Amplifier 642 receives the sensed signal at 620 and provides an amplified sensed signal at 648. Low pass filter 644 receives and filters the amplified sensed signal at 648 and provides a filtered sensed signal at 650. Main comparator 646 receives the filtered sensed signal at 650 and provides a sensed output signal at 622. Digital logic circuit 610 receives the sensed output signal at 622 and provides an output signal to other circuits, where the output signal corresponds to the sensed signals from sensor circuit 614. Also, digital logic circuit 610 provides an offset feedback signal at 632 to multiplexer 604.

In self-test mode operation, sensor 600 generates an oscillating test output signal OUT at 622 and measures characteristics of the test output signal OUT at 622 to test analog circuit 608 and offset DAC 606. Amplifier 642 receives the test offset signal at 630 from offset DAC 606 and switches the amplified test signal at 648 to produce an oscillation in test output signal OUT at 622. Low pass filter 644 receives and filters the amplified test signal at 648 and provides a filtered test signal at 650. Main comparator 646 receives the filtered test signal at 650 and provides test output signal OUT at 622. Digital delay circuit 610 receives test output signal OUT at 622 and delays the output signal to provide a delayed feedback signal at 624. Up/down counter 602 receives the delayed feedback signal at 624 and provides a count in a delayed feedback signal at 626. Offset DAC 606 receives the delayed feedback signal at 626 via multiplexer 604 and fourth feedback path 628. This repeats, with amplifier 642 receiving the test offset signal at 630 from offset DAC 606 and switching the amplified test signal at 648 to provide an oscillation in test output signal OUT at 622. Digital logic circuit 610 receives test output signal OUT at 622 and measures characteristics of test output signal OUT at 622. If the characteristics of test output signal OUT at 622 and/or other signals from analog circuit 608 are outside established limits, analog circuit 608 and/or one or more circuits in the feedback path, such as digital delay circuit 612, up/down counter 602 and/or offset DAC 606, is not functioning properly and digital logic circuit 610 reports the failure or malfunctioning of sensor 600.

The systems and sensors described herein generate oscillating output signals to test analog and mixed signal circuits. The systems and sensors measure the characteristics of the oscillating output signals and/or other signals to test the circuits. If the circuits are not functioning within established limits, the systems detect the failure and provide measures, such as reporting the error. The systems can be configured to perform selected measurements or all measurements at selected times. Self-testing of the systems can be used for production testing, such as production testing after assembly of the systems, at power-up of the systems and/or at other selected times in the application (e.g., a specific time after power is turned on). Also, self-testing can be triggered via an external circuit, such as the electronic control unit (ECU) of a car.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system comprising:
  a first circuit including analog components that receive an input signal and provide one or more of a first output signal on a first path and a second output signal on a second path based on the input signal; and
  a second circuit that measures characteristics of the first output signal to test the first circuit, wherein at least one of the first output signal and the second output signal is fed back to the first circuit via a feedback loop to provide the input signal and generate an oscillation in the first output signal.

2. The system of claim 1, comprising:
  a switch that prevents feedback of the at least one of the first output signal and the second output signal in normal mode operation and facilitates feedback of the at least one of the first output signal and the second output signal in test mode operation.

3. The system of claim 1, comprising:
  a sensor circuit that provides sensed signals, wherein the first circuit processes the sensed signals and provides sensed output signals in normal mode operation.

4. The system of claim 1, wherein the first circuit includes at least one of an amplifier, a filter, a comparator, and a digital component.

5. The system of claim 1, wherein the second circuit measures at least one of amplitude, frequency, duty cycle, jitter, noise, phase differences, offset, and switching pulses in the first output signal.

6. The system of claim 1, comprising:
  a hysteresis comparator, wherein the at least one of the first output signal and the second output signal is fed back to the first circuit via the feedback loop to provide the input signal by the hysteresis comparator.

7. The system of claim 1, comprising:
  a delay circuit, wherein the at least one of the first output signal and the second output signal is fed back to the first circuit via the feedback loop to provide the input signal via the delay circuit.

8. The system of claim 7, wherein switching levels in the delay circuit are shifted to delay the at least one of the first output signal and the second output signal.

9. The system of claim 7, wherein the delay circuit includes at least one of a digital delay, a filter, and an up/down counter.

10. The system of claim 7, wherein the delay circuit includes a digital delay that is clocked via a clock generator and the analog components include a low pass filter having first resistor and capacitor characteristics and the clock generator uses a bandgap reference, wherein the clock generator and the bandgap reference provide second resistor and capacitor characteristics that are substantially the same as the first resistor and capacitor characteristics.

11. A system comprising:
  a sensor circuit configured to provide sensed signals;
  a first circuit including analog components configured to receive the sensed signals and provide a first output signal based on the sensed signals and to receive an input signal and provide a second output signal based on the input signal;
  a second circuit configured to feed back the second output signal to the analog components and generate an oscillation in the second output signal, wherein the second circuit comprises a hysteresis comparator; and
  a third circuit configured to measure characteristics of the second output signal.

12. The system of claim 11, wherein the sensor circuit is one of a magnetic sensor, an optical sensor, an inductive sensor, a capacitive sensor and a resistive sensor.

13. The system of claim 11, wherein the second circuit includes a delay circuit and the delay circuit includes at least one of a digital delay, a filter, and an up/down counter.

14. A system comprising:
a sensor circuit configured to provide sensed signals;
a first circuit including analog components configured to receive the sensed signals and provide a first output signal based on the sensed signals and to receive an input signal and provide a second output signal based on the input signal;
a second circuit configured to feed back the second output signal to the analog components and generate an oscillation in the second output signal; and
a third circuit configured to measure characteristics of the second output signal, wherein the third circuit measures characteristics of the second output signal during at least one of production test, power-up of the system, and application operations.

15. A method of testing a system comprising:
receiving an input signal at a circuit including analog components;
providing one or more of a first output signal and a second output signal based on the input signal via the analog components;
feeding back at least one of the first output signal and the second output signal to the circuit via a feedback loop to provide the input signal and to generate an oscillation in the first output signal; and
measuring characteristics of the first output signal to test the analog components.

16. The method of claim 15, wherein feeding back comprises:
delaying the at least one of the first output signal and the second output signal to provide the input signal.

17. The method of claim 15, wherein feeding back comprises:
delaying the at least one of the first output signal and the second output signal via a delay circuit.

18. The method of claim 15, comprising:
sensing via a sensor circuit;
providing sensed signals to the analog components; and
providing sensed output signals via the analog components.

19. The method of claim 15, wherein measuring characteristics of the first output signal comprises:
measuring at least one of root-mean-square of amplitude, amplitude crest, amplitude peak, frequency, frequency components, phase differences, duty cycle, jitter, offset, and switching pulses in the first output signal.

20. A method of testing a system comprising:
receiving an input signal at a circuit including analog components;
providing an output signal based on the input signal via the analog components;
feeding back at least one of the output signal and another output signal to provide the input signal and to generate an oscillation in the output signal; and
measuring characteristics of the output signal to test the analog components, wherein feeding back comprises:
feeding back a hysteresis comparator output signal.

21. A method of testing a system comprising:
sensing via a sensor circuit;
providing sensed signals to analog components;
providing a first output signal based on the sensed signals via the analog components;
receiving an input signal via the analog components;
providing a second output signal based on the input signal via the analog components;
feeding back the second output signal to the analog components to generate an oscillation in the second output signal; and
measuring characteristics of the second output signal during at least one of production test, power-up of the system, and application operations.

22. The method of claim 21, wherein sensing comprises:
sensing changes in a magnetic field via magnetic sensing elements.

23. The method of claim 21, wherein feeding back the second output signal comprises:
delaying the second output signal to provide the input signal.

24. A system comprising:
a first circuit that operates in a normal mode and a test mode, wherein the first circuit receives a first input signal in the normal mode and provides a first output signal based on the first input signal and the first circuit receives a second input signal in the test mode and provides a second output signal based on the second input signal;
a second circuit that measures at least one characteristic of the second output signal to test the first circuit in the test mode; and
a delay circuit that operates in only the test mode, wherein the delay circuit receives the second output signal and feeds back the second output signal to the first circuit via a feedback loop to provide the second input signal to the first circuit to generate an oscillation in the second output signal.

* * * * *